US006879271B2

(12) United States Patent  
Abdat

(10) Patent No.: US 6,879,271 B2  
(45) Date of Patent: Apr. 12, 2005

(54) METHOD AND APPARATUS FOR ADAPTIVE DATA COMPRESSION

(75) Inventor: Mourad Abdat, Nepean (CA)

(73) Assignee: MOSAID Technologies, Inc., Kanata (CA)

( * ) Notice: Subject to any disclaimer, the term of this patent is extended or adjusted under 35 U.S.C. 154(b) by 0 days.

(21) Appl. No.: 10/788,003

(22) Filed: Feb. 27, 2004

(65) Prior Publication Data

US 2005/0030208 A1 Feb. 10, 2005

Related U.S. Application Data

(63) Continuation of application No. 10/420,018, filed on Apr. 18, 2003, now Pat. No. 6,700,512, which is a continuation of application No. 09/782,614, filed on Feb. 13, 2001, now Pat. No. 6,606,040.

(51) Int. Cl.$^7$ ............................................... H03M 7/30
(52) U.S. Cl. ........................ 341/87; 341/50; 341/106
(58) Field of Search ........................... 341/87, 50, 106, 341/51, 95; 379/93.28

(56) References Cited

U.S. PATENT DOCUMENTS

| | | | |
|---|---|---|---|
| 4,558,302 A | | 12/1985 | Welch |
| 5,049,881 A | | 9/1991 | Gibson et al. |
| 5,373,290 A | | 12/1994 | Lempel et al. |
| 5,389,922 A | * | 2/1995 | Seroussi et al. ............... 341/51 |
| 5,455,576 A | | 10/1995 | Clark, II et al. |
| 5,469,161 A | | 11/1995 | Bezek |
| 5,703,581 A | * | 12/1997 | Matias et al. .................. 341/67 |
| 5,903,230 A | | 5/1999 | Masenas |
| 6,658,097 B2 | * | 12/2003 | Hofer et al. .............. 379/93.28 |

OTHER PUBLICATIONS

Granville, F., "Lossless compression core hits 100 Mbytes/sec", *EDN*, (Mar. 13, 1998).

Kjelsø, M., Gooch M., Jones S., "Performance evaluation of computer architectures with main memory data compression", *J. Systems Architecture*, 45, pp. 571–590 (1999).

Núñnez, J. L., Jones, S., "The X–MatchPro 100 Mbytes/second FPGA–Based Lossless Data Compressor", Electronic Systems Design Group, Loughborough University, Leicestershire, England (date), no date.

Jiang, J., Jones, S., "Design of Dynamic LZW Compression Algorithm", Parallel and Novel Architectures Group, Dept. of Electrical and Electronic Engineering, University of Nottingham, (date), no date.

(Continued)

*Primary Examiner*—Jean Bruner Jeanglaude
(74) *Attorney, Agent, or Firm*—Hamilton, Brook, Smith & Reynolds, P.C.

(57) ABSTRACT

We present a method and apparatus for performing adaptive data compression. An alphabet and vocabulary in the encoder and decoder is built adaptively and stored in a dictionary as symbols are to be encoded and decoded. Each time an unknown symbol is to be encoded by the encoder, the encoder adds the symbol to the dictionary and transmits it in plain in the encoded string. The code words transmitted by the encoder include symbols and indexes. The state of a prefix bit preceding the code word indicates whether the code word is a plain symbol or an index of a symbol or string of symbols stored in the dictionary. The decoder examines the prefix bit of each code word as it is received to determine if the code word stores a symbol in plain or in index. If the code word stores a symbol in plain, the decoder learns the symbol by adding a sequence of symbols resulting from the concatenation of previously decoded symbols and the first symbol of the currently decoded symbol and by adding the symbol to its dictionary. If the code word stores an index, the decoder decodes the code word by extracting the symbol or sequence of symbols stored in the dictionary at the respective index in the dictionary.

8 Claims, 10 Drawing Sheets

OTHER PUBLICATIONS

Pentakalos, O. I., Yesha, Y., "Online Data Compression in a Mass Storage File System", Abstract #28, Computer Science Department, University of Maryland, Baltimore, Maryland (date), No date.

Burroughs, S.H. and Lattrell, T. R., "Data compression technology in ASIC cores", *J. Research and Development*, 42(6), IBM (1998).

Craft, D.J.,"A fast hardware data compression algorithm and some algorithmic extensions", *J. Research and Development*, 42(6), IBM (1998).

Kemp, T. M., et al., "A decompression core for PowerPC", *J. Research and Development*, 42(6), IBM (1998).

Kampf, F. A., "Performance as a function of compression", *J. Research and Development*, 42(6), IBM (1998).

Storer, J. A. and Szymanski T. G., "Data Compression via Textual Substitution", *J. of Association for Computing Machninery* 29(4): 928–951 (Apr. 1982).

Yokoo, H., "Improved Variations Relating the Ziv–Lempel and Welch–Type Algorithms for Sequential Data Compression", *IEEE Transactions on Information Theory*, 38(1): 73–81 (Jan. 1992).

Ziv, J. and Lempel, A., "Compression of Individual Sequences via Variable–Rate Coding", *IEEE Transactions on Information Theory*, IT–24 (5): 530–536 (Sept. 1978).

Welch, T. A., "A Technique for High–Performance Data Compression", Sperry Research Center, *Computer*, 17(6): 8–10, (Jun. 1984).

Nelson, M. R., "LZW Data Compression", *Dr. Dobb's Journal*, pp. 29–36 (Oct. 1989).

Bunton, S. and Borriello, G., "Practical Dictionary Management for Hardware Data Compression", *Communications of the ACM* 35(1): 95–104 (Jan. 1992).

Ouaissa, K., et al., "Adaptive limitation of the dictionary size in LZW data compression", *International Symposium on Information Theory*, ISIT (1995).

* cited by examiner

| PREFIX = 0 | PLAIN SYMBOL |
|---|---|
| 404 | 406 |

FIG. 4A

| PREFIX = 1 | TABLE INDEX |
|---|---|
| 404 | 408 |

FIG. 4B

METHOD AND APPARATUS FOR ADAPTIVE DATA COMPRESSION

RELATED APPLICATIONS

This application is a continuation of U.S. application Ser. No. 10/420,018, filed Apr. 18, 2003 which is now U.S. Pat. No. 6,700,512, which is a continuation of U.S. application Ser. No. 09/782,614, filed Feb. 13, 2001, which was issued as U.S. Pat. No. 6,606,040 on Aug. 12, 2003. The entire teachings of the above applications are incorporated herein by reference.

BACKGROUND OF THE INVENTION

Data compression refers to the process of reducing the amount of data needed to represent a given information. The underlying basis of the reduction process is the removal of redundant or unnecessary data. Data compression techniques reduce the costs for information storage and transmission. Data compression techniques are used in many applications, ranging from simple file size reduction to speech and video encoding.

There are two different types of compression: lossless and lossy. In lossless compression, the source message at the encoder input is retrieved exactly at the output of the decoder. In lossy compression, the message is not retrieved exactly, but the information loss is tolerable for the type of application targeted by the compression schemes. Lossy compression is mainly used for speech, audio, image and video signals. The aim of the compression algorithm is to represent the signal with a minimum number of bits while maintaining the signal intelligibility and perceptual quality. All the information that cannot be perceived by human sensors can be removed.

Lossless compression techniques are used in applications where no information loss is tolerable such as compressing executable and source code files, satellite imaging and medical imaging. The techniques are also used as part of lossy compression schemes for better compression ratios.

One well-known technique for performing lossless compression is the LZW Lempel-Ziv-Welch ("LZW") algorithm. The LZW algorithm is a universal algorithm based on string parsing according to a fixed rule. It is based on the concept that often used sequences can be encoded in a lesser number of bits than would be required to spell out the entire sequence. The LZW algorithm requires the initialization of a table with the alphabet of the source. A symbol width is selected and the source alphabet is created for the symbols and stored in a coding table in the encoder and the decoder before the start of the encoding process. The LZW algorithm adds selected sequences of symbols (vocabulary) to a dictionary as it encodes received sequences of symbols. Sequences contained in the dictionary can be encoded with a lesser number of bits than that required to spell out the entire sequence with symbols. The size of the source alphabet is dependent on the width of the symbol. For example, a symbol width of 1 byte (8 bits) requires a source alphabet of 28 (256) entries and a symbol width of 2 bytes (16 bits) requires a source alphabet of 216 (64K) entries. Typically, the LZW algorithm is implemented with a symbol width of one byte (8 bits). The LZW algorithm searches the coding table for the longest match in a received sequence of symbols and transmits the index of the longest match stored in the dictionary.

FIG. 1 illustrates a prior art LZW coding table 100 in an encoder and decoder for performing lossless data compression. The LZW coding table 100 can be a ternary Contents Addressable Memory ("CAM"). The input sequence of symbols 102 is translated to a sequence of indexes by the encoder using the source alphabet 106 and dictionary 108 stored in the LZW coding table 100. The coding table 100 in the encoder 110 and the decoding table 120 in decoder 112 include the source alphabet 106 and dictionary 108. The sequence of indexes 114 is transmitted by the encoder 110 and decoded by the decoder 112. The decoder 112 provides an output string 104 with the same symbols as the input sequence of symbols 102. The source alphabet 106 is stored in the LZW coding table 100 in the encoder 110 and the decoder 112 before the encoder 110 starts to encode the input sequence of symbols 102. The sequence of indexes 114 transmitted from the encoder 110 to the decoder 112 are indexes of plain text symbols stored in the source alphabet 106 or indexes of strings of symbols stored in the dictionary 108. The encoder 110 and the decoder 112 independently create entries in their respective dictionaries by learning new sequences of symbols dependent on the initial source alphabet. The encoder 110 adds a new sequence of symbols in the dictionary but transmits the index of the previously learned symbols or sequence of symbols to the decoder 112 in the sequence of indexes 114. The decoder also learns the new sequence of symbols and stores the new sequence of symbols at a new index in the LZW decoding table 120 in the dictionary 108.

FIG. 2 illustrates a prior art LZW compression of an input string in the encoder 110 shown in FIG. 1. The source alphabet 106 (FIG. 1) is stored in the LZW coding table 100 (FIG. 1) before the encoder 110 (FIG. 1) starts parsing the input sequence of symbols 102 or before the decoder starts decoding. The source alphabet 106 (FIG. 1) for an 8-bit symbol is stored at indexes 0–255 in the coding table 100 (FIG. 1) and the decoding table 120 (FIG. 1). The contents of five of the 256 locations in the source alphabet 106 (FIG. 1) are shown. Symbol '/' is stored at index 47, symbol 'b' is stored at index 98, symbol 'd' is stored at index 100, symbol 'e' is stored at index 101, symbol 't' is stored at index 116 and symbol 'w' is stored at index 119. An additional entry 256 at index 256 in the source alphabet 106 in the LZW coding table 100 stores End Of String ("EOS"), and entry 257 at index 257 in the dictionary 108 in the LZW coding table 100 stores a Flush code.

An input sequence of symbols 102 is received by the encoder 110 (FIG. 1). The encoder 110 (FIG. 1) parses the input sequence of symbols 102 and transmits the sequence of indexes 114 (FIG. 1). The input sequence of symbols 102 is encoded by the encoder 110 (FIG. 1) by parsing the input sequence of symbols 102 and searching the LZW coding table 100 for the longest match for the symbols and transmitted as a sequence of indexes (code words) for entries in the LZW coding table 100. An index can be a pointer to an entry in the source alphabet 106 or the dictionary 108.

As shown in the LZW coding table 100, the index for the entry in the source alphabet 106 storing the symbol '/' is 47. Initially, the coding table 100 stores only the source alphabet 106. As a sequence of symbols 102 is received by the encoder 110 (FIG. 1), the encoder 110 (FIG. 1) parses the sequence of symbols 102 dependent on the symbol width. The encoder 110 (FIG. 1) selects a symbol in the sequence of symbols 102 (FIG. 1) and searches the LZW coding table 100 for the symbol. The encoder learns vocabulary by concatenating known symbols and sequences of symbols. If the symbol is found, the symbol is concatenated with the next symbol, and the LZW coding table 100 is searched for a sequence of symbols formed by the two symbols. If the sequence of symbols is not stored in the LZW coding table 100, the index of the previously identified symbol or sequence of symbols is transmitted and the new sequence of symbols is added to the LZW coding table 100.

The operation of the encoder using the LZW algorithm is illustrated using the input sequence of symbols 102: /wed/ we/wee/web/wet/ as shown in FIG. 2 and a symbol width of one character (8 bits). The coding table 100 stores the initial alphabet which includes an entry for each 8-bit symbol including '/', 'w', 'e', 'd', 'b' and 't'.

The parsing of the input sequence of symbols 102 starts with symbol '/'. Symbol '/' is stored in the LZW coding table 100 at index 47, '/' is concatenated with the next symbol 'w', and the coding table is searched for the sequence of symbols '/w'; since '/w' is not then stored in the LZW coding table 100, '/w' is learned by storing '/w' at the next sequential index 258. The index for '/'; that is, 47 the previously identified symbol is transmitted in the sequence of indexes 104.

Parsing starts again at symbol 'w' in the input sequence of symbols 102. The LZW coding table 100 is searched for symbol 'w'. Symbol 'w' is stored in the LZW coding table 100 at index 119, symbol 'w' is concatenated with the next symbol 'e' in the input sequence of symbols 102 and coding table is searched for the sequence of symbols 'we'. Since 'we' is not then stored in the coding table 100, 'we' is learned by storing 'we' in the coding table at the next sequential index 259. The index for 'w'; that is, 119 the previously identified symbol is transmitted in the sequence of indexes 104.

Parsing starts again at symbol 'e' in the input sequence of symbols 102. Symbol 'e' is stored in the LZW coding table 100 at index 101. Symbol 'e' is concatenated with the next symbol 'd' in the input sequence of symbols and the LZW coding table 100 is searched for the sequence of symbols 'ed'. Since, 'ed' is not stored in the LZW coding table 100, 'ed' is learned by storing 'ed' in the next sequential entry in the coding table at index 260. The index for 'e', that is, 101, the previously identified symbol is transmitted in the sequence of indexes 104.

Parsing starts again at symbol 'd' in the input sequence of symbols 102. Symbol 'd' is stored in the coding table 100 at index 100. Symbol 'd' is concatenated with the next symbol '/' in the input sequence of symbols 102 and the LZW coding table 100 is searched for the sequence of symbols 'd/'. Since, 'd/' is not stored in the LZW coding table 100, 'd/' is learned by storing 'd/' in the next sequential entry in the coding table at index 261. The index for the previously identified symbol 'd', 100, is transmitted in the sequence of indexes 104.

Parsing starts again from the symbol '/' in the input sequence of symbols 102. Symbol '/' is stored in the LZW coding table 100 at index 47. Symbol '/' is concatenated with the next symbol 'w' in the input sequence of symbols 102 and the LZW coding table 100 is searched for the sequence of symbols '/w'. '/w' is stored in the coding table 100 at index 258, '/w' is concatenated with 'e' in the input sequence of symbols 102 and the coding table is searched for the sequence of symbols '/we'. Since '/we' is not stored in the coding table 100, '/we' is learned by storing '/we' in the next sequential entry in the LZW coding table at index 262. The index for the previously identified sequence of symbols '/w', 258, is transmitted in the sequence of indexes 104.

For example, for a symbol width of 8 bits, upon finding a match for the 24 bit (3 bytes×8 bits) per byte string of characters '/we', a 9-bit index (the address of the string of symbols '/we' stored in the dictionary) is transmitted from the encoder to the decoder. This reduces the number of bits transmitted from 24 to 9. Upon receiving the 9-bit index the decoder regenerates the string of characters '/we' stored at the 9-bit index in its copy of the dictionary. If no corresponding sequence (prefix) had been found in the dictionary, indexes for the individual symbols '/', 'w' and 'e' would be transmitted.

Transmission of the input sequence of twenty symbols 102 requires 160 bits (20 symbols×8 bits per symbol). The LZW algorithm reduces the number of bits transmitted to 126 bits (14 indices×9 bits). As the input sequence of symbols 102 is parsed, the vocabulary stored in the dictionary 108 in the coding table 100 increases and the lengths of the sequences of symbols stored in the coding table increase. For example, index 264 represents a sequence of four symbols '/wee'.

The longer the sequence of symbols stored in the coding table, the better the compression because the number of indexes transmitted is decreased. Compression can also be improved by increasing the symbol width. However, the initial source alphabet required by the LZW algorithm increases by two for each bit added to the symbol width and thus requires an impractical table size for encoding an initial source alphabet for symbol widths of several bytes.

SUMMARY OF THE INVENTION

The present invention does not require initialization of a source alphabet in the dictionary. Instead, both the alphabet and vocabulary are learned and stored in the dictionary during the encoding of the input string of symbols.

Furthermore, in the prior art LZW, a large alphabet requires large symbol width indexes. An alphabet of 256 one byte symbols requires the indexes to start with 9 bits, an alphabet of 16384 two byte symbols requires an initial index of 17 bits. The width of the index directly affects the compression ratio. In the present invention, the size of the alphabet has no direct effect on the index width. Furthermore, only symbols which are used by a source are learned to the dictionary. Thus, the invention is suitable for sparse sources.

The dictionary is searched for a symbol or sequence of symbols received in a string of symbols. Upon detecting that the symbol is not stored in the dictionary the symbol is learned by storing the symbol in the dictionary, and the plain symbol is transmitted in a code word.

Upon detecting that a symbol or sequence of symbols is stored in the dictionary, the index at which the symbol or sequence of symbols is stored in the dictionary is transmitted in the code word. A state of a prefix field in the code word may identify the contents of the code word as either plain symbol to be learned or an index. The dictionary index may be of variable width dependent on the number of symbols and sequences of symbols that have been learned.

The symbol width may be selected dependent on the type of data. For example, for transmission of text, a single byte can readily define an individual character. However, for audio or video data, longer symbol widths by which streams of data are parsed may provide better compression. Because all symbols are not initially stored, but are only stored in the dictionary as they occur, large symbol widths can be used without fear of initially overloading memory.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 4A illustrates the code word transmitted in the encoded string by the encoder to transmit a plain symbol learned by the encoder shown in FIG. 3;

FIG. 4B illustrates the code word transmitted in the encoded string for a symbol which has already been learned and is stored in the coding table, and the decoding table shown in FIG. 3;

DETAILED DESCRIPTION OF THE INVENTION

A description of preferred embodiments of the invention follows.

Figure 1:
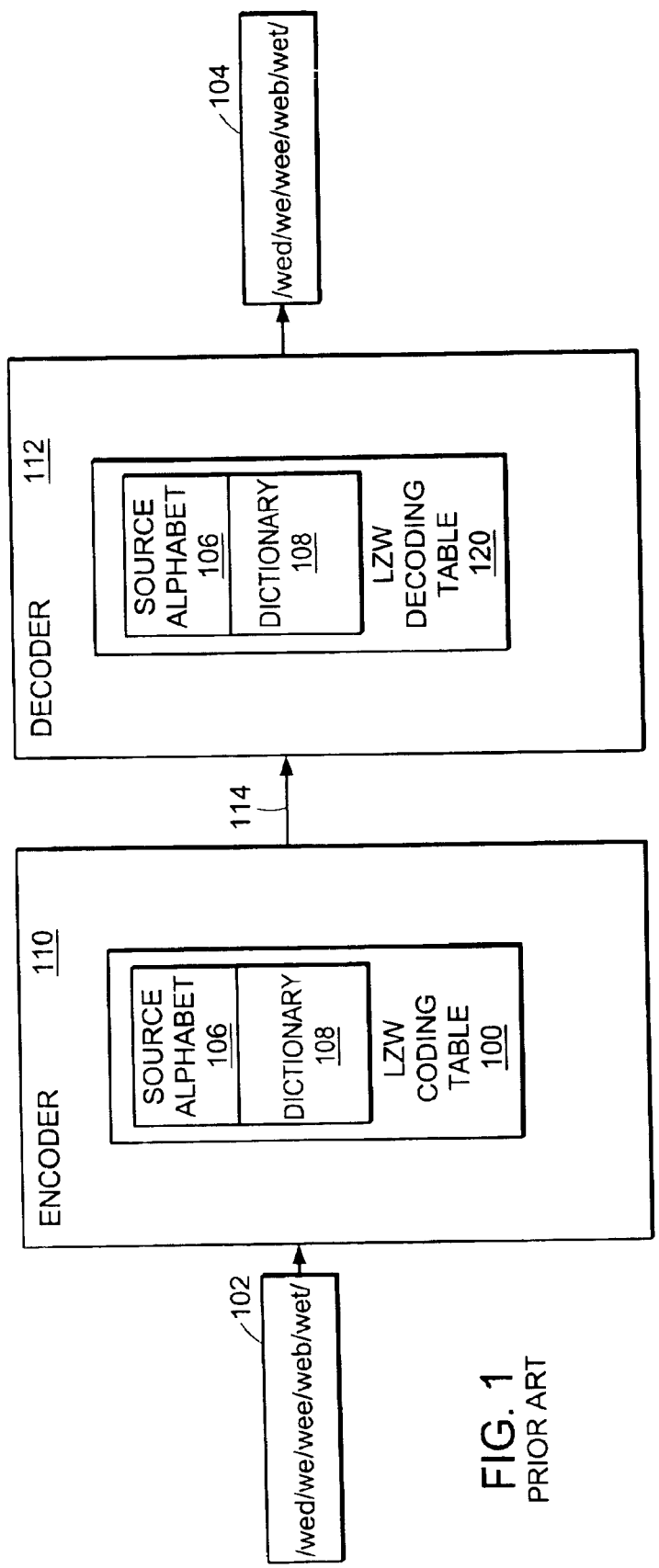
FIG. 1 illustrates a prior art LZW coding table implemented in an encoder and an LZW decoding table implemented in a decoder for performing lossless data compression.
Figure 2:
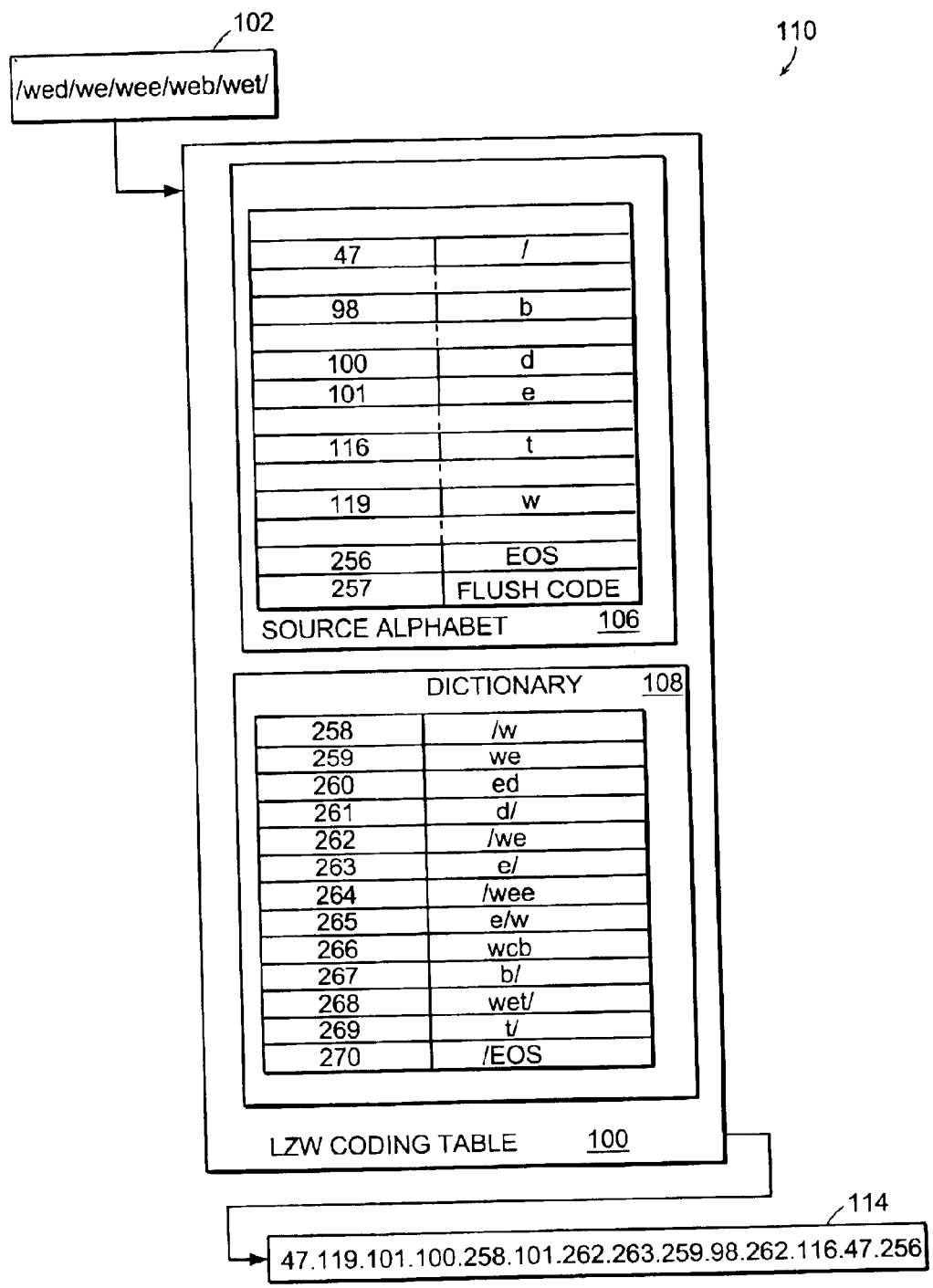
FIG. 2 illustrates a prior art LZW compression of an input string in the encoder shown in FIG. 1.
Figure 3:
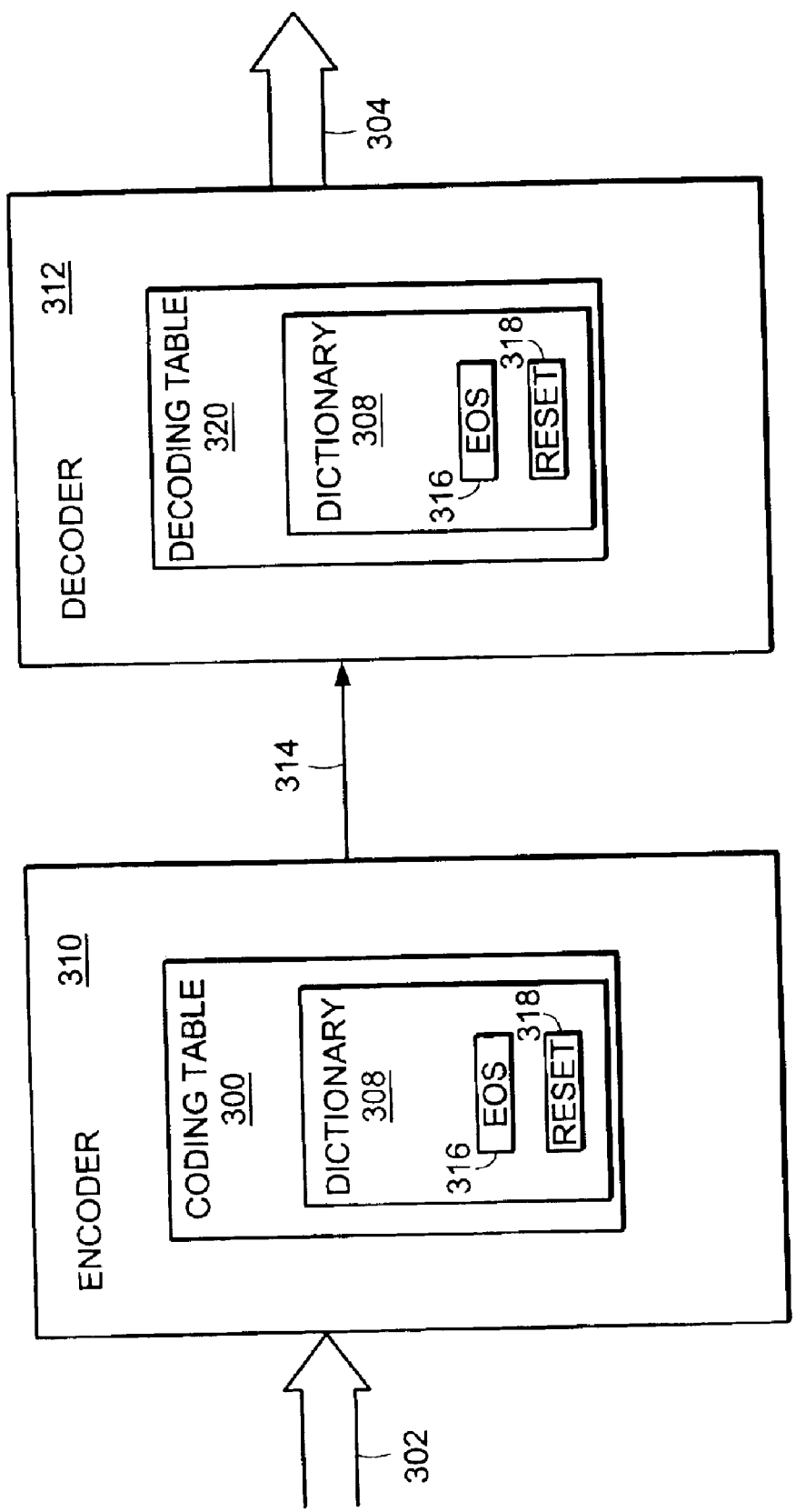
FIG. 3 illustrates a coding table implemented in an encoder and a decoding table implemented in a decoder for performing lossless compression according to the principles of the present invention.

FIG. 3 illustrates an encoder 310 including a coding table 300 and a decoder 312 including a decoding table 320 for performing lossless compression according to the principles of the present invention. The encoder 310 starts encoding and the decoder 312 starts decoding without an initial source alphabet stored in the dictionary 308. The alphabet is learned while the encoder parses an input string of symbols 302. A symbol is the unit at which the input string 302 is parsed. The symbol can be an arbitrary width, for example, multiple characters. Each code word output by the encoder is prefixed by one bit to allow the decoder 312 to learn the alphabet. As a symbol is learned by the encoder 310, the encoder 310 transmits the symbol in plain in a code word preceded by a bit set to '0'. If the symbol is known, the encoder 310 transmits an index preceded by a bit set to '1'. There is no limitation on width of the symbol because there is no initial table that can be limited by memory size. The alphabet is learned dynamically. To decode the code words, the decoder 312 first identifies the bit indicating the type of data. If the bit value is '0', the decoder 312 outputs the symbol directly. If the bit value is '1', a translation of the index is made, using the dictionary.

Each time a plain symbol is transmitted to the decoder 312, the decoder 312 adds the symbol to its dictionary 308. Thus, the entire source alphabet does not need to be stored. Instead, only symbols that are received by the decoder are stored in the dictionary 308.

The encoder 310 takes an input string 302, compresses the input string using symbols and sequences of symbols stored in the dictionary 308 in the coding table 300 and transmits the encoded string 314. In one embodiment, the encoded string 314 can be transmitted in a data packet over a network and decoded in a decoder in the receiving node. In an alternative embodiment, the encoded data can be transmitted to a storage device.

Unlike the prior art LZW algorithm, a source alphabet for the symbol is not stored in the coding table 300 before the encoder 310 starts parsing the input string 302. Instead, the encoder 310 learns the source alphabet and vocabulary as it parses the input string 302. The encoder 310 forwards newly learned symbols on encoded string 314 in plain so that the decoder can learn the source alphabet.

The string of symbols 302 received by the encoder 310 is encoded to remove redundant or unnecessary data. The encoder 310 encodes the string of symbols dependent on a selected symbol width and dictionary 308 stored in the coding table 300. The encoded string 314 is transmitted to the decoder 312. The encoded string 314 is a sequence of code words. Each code word includes a symbol or an index to a symbol or symbol sequence stored in the dictionary 308.

The decoder 312 learns the alphabet and vocabulary transmitted in the encoded string 314 received from the encoder 310 and stores them in the dictionary 308 in the decoding table 320. The decoder 312 decodes the received encoded string 314 dependent on the source alphabet and vocabulary learned in the dictionary 308 in the decoding table 320, to provide the original string of symbols.

In one embodiment, the coding table 300 in the encoder 310 and the decoding table 320 in the decoder 312 are implemented in a binary or ternary Contents Addressable Memory ("CAM"). The CAM has a search and learn capability. The search and learn capability allows the CAM to learn a search key if the search key is not found in the CAM. If the search key is stored in an entry in the CAM, the CAM returns the matching address for the search key. If the search key is not stored in an entry in the CAM, the CAM learns a new search key by storing the new search key in a CAM entry. The coding table 300 and the decoding table 320, are initialized with two entries, End of String ("EOS") 316 and a flush code 318. The index of the flush code 318 is transmitted to indicate that the coding table 300 is full. When the coding table 300 is full, all of the entries except for the EOS and flush code are cleared and the symbols and vocabulary are learned again as the string of symbols is received. The flush code is transmitted to the decoder so that the decoder 312 can initialize its decoding table 320. The initialization of the coding table 300 is described later in conjunction with FIG. 6. The index of the EOS entry is transmitted at the end of the encoding process.

By not requiring an initial source alphabet, the width of a symbol is no longer limited by the memory required to store the initial source alphabet. Furthermore, the initial index width is no longer affected by the alphabet size of the source. The width of a symbol can be modified during the encoding process because symbols are transmitted on encoded string 314, allowing the decoder 312 to learn a new alphabet. The compression ratio can be monitored during the encoding process and the symbol width modified appropriately in order to increase the compression ratio. For example, the type of data to be compressed can change as the type of data requested by a user over the Internet changes. For example, the type of data requested can change from audio file, to image file and then to a text file. By providing the ability to modify the symbol width as the type of data being transferred changes, the optimal symbol width can be selected for the particular type of received string of symbols. Also, large symbols such as, a 4×4 pixel block (16 bytes) in an image can be compressed without requiring a large memory to store an initial source alphabet for the symbol.

The maximum symbol width is dependent on the physical width of the coding table 300 and decoding table 320. For example, a 7-byte (56 bits) symbol can be stored in a 72-bit wide CAM. A 72-bit wide CAM provides 56 bits (7 bytes) to store the symbol and fourteen bits for storing an index to another CAM entry. A 144-bit CAM can store a wider symbol. The format of the code words transmitted from the encoder 310 as encoded string 314 to the decoder 312 is described in conjunction with FIGS. 4A–4B.

In an alternative embodiment, the encoder 310 and decoder 312 can be implemented as instructions stored in memory and executed by a processor.

FIG. 4A illustrates a code word transmitted on encoded string 314 by the encoder 310 to transmit a plain symbol learned by the encoder 310 shown in FIG. 3. As the encoder 310 (FIG. 3) learns a new symbol by storing the plain symbol in the coding table 300 (FIG. 3), the encoder 310 (FIG. 3) transmits the symbol in plain as encoded string 314 (FIG. 3) to the decoder 312 (FIG. 3). The symbol is transmitted in plain stored in a plain symbol field 406. The plain symbol field 406 is preceded by a prefix bit 404. The prefix bit 404 is set to '0' to indicate that plain symbol follows. For example, if the symbol width is two bytes and the symbol to be learned is '/w', '/w' is stored in plain symbol field 406 and '0' is stored in the prefix bit 404.

FIG. 4B illustrates the code word transmitted on encoded string 314 (FIG. 3) for a symbol or sequence of symbols which is known and stored in the coding table 300 shown in FIG. 3. The code word includes a table index field 408 preceded by a prefix bit 404. A table index is stored in the table index field 408 preceded by the prefix bit 404 set to '1'. The table index field 408 stores the index of the entry storing the symbol or sequence of symbols in the coding table 300 and decoding table 320.

The width of table index field 408 is variable dependent on the number of entries stored in the coding table 300 and decoding table 320. For example, if there are less than 4 entries stored in the coding table 300 and decoding table 320, the table index field 408 is 2-bits wide. If there are between 128 and 255 entries stored in the coding table 300 and decoding table 320, the table index field 408 is 8-bits wide.

Figure 5:
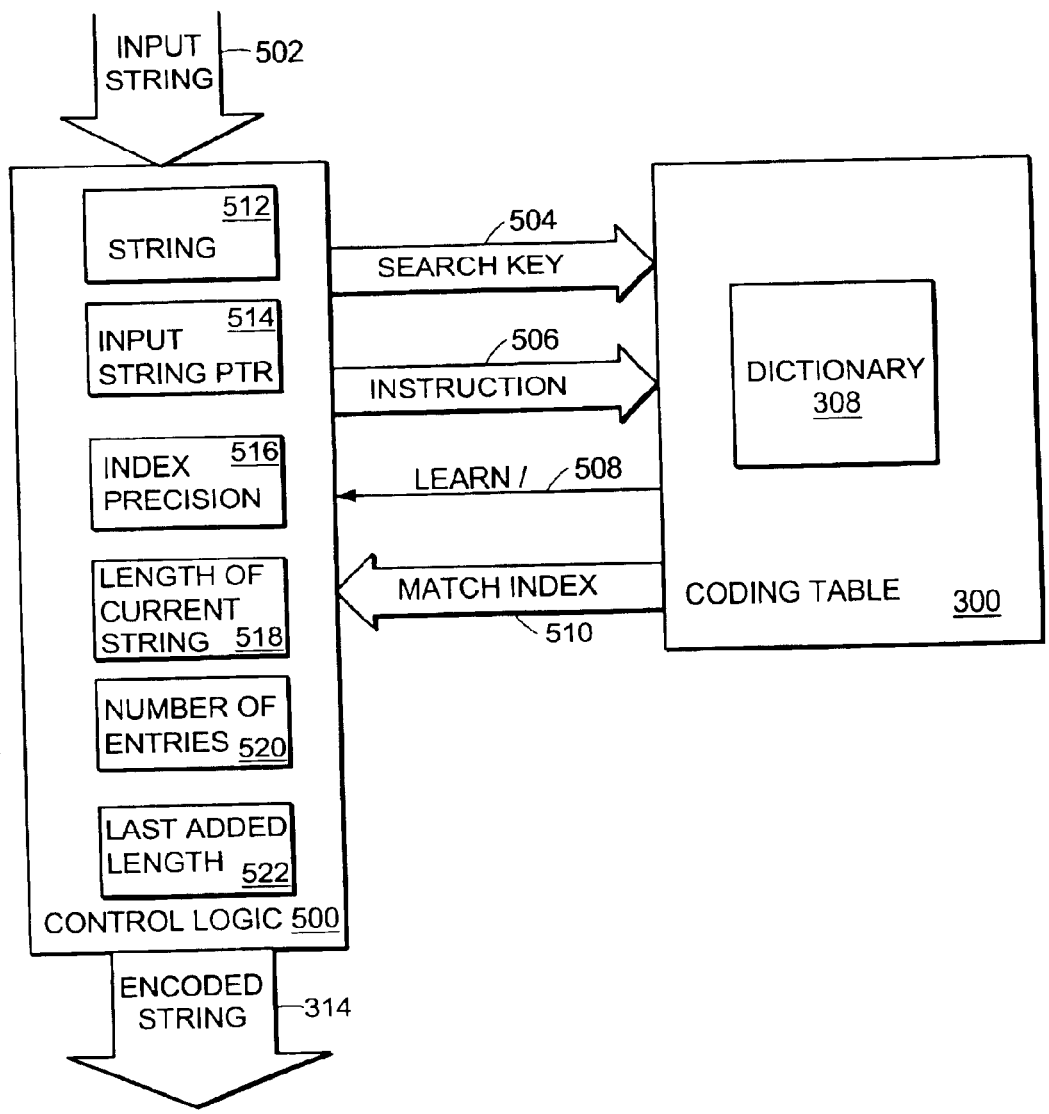
FIG. 5 illustrates control logic and the coding table implemented in the encoder shown in FIG. 3 for translating an input string to code words transmitted in an encoded string.

FIG. 5 illustrates control logic 500 and the coding table 300 in the encoder 310 shown in FIG. 3 for encoding an input string 502 to an encoded string 314 (FIG. 3). The control logic 500 parses the input string 502 to provide the encoded string 314 (FIG. 3). The encoded string 314 (FIG. 3) transmitted by the control logic includes code words which include plain symbol stored in plain symbol field 406 (FIG. 4A) preceded by a prefix bit 404 (FIG. 4A) set to '0' or a table index stored in a table index field 408 (FIG. 4B) preceded by a prefix bit 404 (FIG. 4B) set to '1'.

The input string 502 includes a plurality of symbols. The width of a symbol is variable, and can be a single character or byte (8-bits) or a plurality of bytes. The width of the symbol can be modified dynamically dependent on the type of data in the input string 502. For example, if a text file is being processed, the symbol width can be selected to be a character width (8-bits). If an image file is being processed, the symbol width can be 16 bytes. The control logic 500 parses the input string 502 dependent on the selected symbol width.

The symbol width can be changed dynamically. The encoder 310 (FIG. 3) can be set to monitor the compression ratio (input number of bits/output number of bits) and if this ratio is low or drops suddenly, the compression algorithm implemented in the control logic 500 (FIG. 5) can automatically try a different symbol width and select the one giving the best ratio. Some thresholds have to be set, for example, the compression ratio at which to change width and which width to try first. A code is reserved for symbol width change and a convention agreed between the encoder 310 (FIG. 3) and decoder 312 (FIG. 3) so that the decoder 312 (FIG. 3) will recognize the new symbol width.

Furthermore, every time the encoder 310 (FIG. 3) changes a symbol width, it sends a special reserved code (not used by strings in the dictionary) followed by the new symbol width.

One method for implementing a symbol width change is to flush the whole coding table 300 (FIG. 5) and restart learning symbols of the new width. This method can be efficient if the new symbol width gives immediately a high compression ratio, but can be penalizing if the new width is not suited to the type of data in the input string 502 (FIG. 5).

Another method which can be used is to flush a part of the dictionary 308 (FIG. 3) for example, all strings not multiple of the new symbol width are removed. This is an intermediate solution because the new symbol width starts with some learned strings in the dictionary 308 (FIG. 3).

The control logic 500 includes a string register 512, an input string pointer 514, an index precision register 516, a length of current string register 518, a number of entries register 520 and a last added length register 522. The control logic 500 uses the string register 512 and the input string pointer 514 to parse the input string 502 and the index precision register 516 for keeping track of the number of bits to transmit in the table index field 408 (FIG. 4B) in the code word transmitted on encoded string 314 (FIG. 3). The string register 512 (FIG. 5) is used for storing the search key and an input string pointer 514 (FIG. 5) is used for storing a pointer to the symbol in the input string 502 (FIG. 5) currently being processed by the control logic 500 (FIG. 5).

The number of entries register 520 is incremented each time a symbol or sequence of symbols is added to the dictionary 308 (FIG. 3). The contents of the number of entries register 520 is monitored by the encoder 310 (FIG. 3) to determine if the dictionary 308 (FIG. 3) is full. Upon determining that the dictionary 308 is full, the encoder 310 (FIG. 3) flushes its dictionary 308 (FIG. 3) and forwards the flush code to the decoder 312 (FIG. 3) so that the decoder 312 (FIG. 3) can also flush its dictionary 308 (FIG. 3).

The contents of the last added length register 522 are used to keep track of the length of the string which was last added to the dictionary 308. If the register is set to '1', a symbol was last added to the dictionary 308. The contents of the length of the current string register 518 is the number of symbols extracted from the input string 502 which are currently being used as the search key.

The dictionary 308 in the coding table 300 is initialized with two entries, EOS at index '0' and flush code at index '1' and symbol width change at index '3' to allow dynamic width change if dynamic width change is required. The EOS and the flush code have already been described in conjunction with FIG. 3. The control logic 500 selects the first symbol in the input string 502 and forwards the symbol as the search key 504 to the coding table 300 together with a 'search and learn' instruction on the instruction bus 506. The coding table 300 searches for the search key 504 stored in an entry in the dictionary 308 in the coding table 300.

If the first symbol is not stored in the dictionary 308, the coding table 300 indicates through learn 508 that it is learning the search key 504 by storing the search key 504 in the dictionary 308. The control logic 500 monitors learn 508 and upon detecting that the coding table 300 is learning the search key 504, the control logic 500 forwards the symbol in a code word as plain symbol in the plain symbol field 406 (FIG. 4A) preceded by a prefix bit 404 (FIG. 4A) set to '0' as described earlier in conjunction with FIG. 4A. The decoder 312 (FIG. 3) detects the prefix bit 404 (FIG. 4A) set to '0' and learns the symbol by storing the plain symbol stored in the plain symbol field 406 in the dictionary 308 (FIG. 3) in the next sequential index to the decoding table 320 (FIG. 3).

If the coding table 300 finds a match for the search key 504, the match index 510 is forwarded to the control logic 500. If a match is found for the search key 504, the encoder 310 searches the dictionary 308 for a longer matching sequence of symbols stored in the dictionary 308. The control logic 500 concatenates the current symbol and the next symbol in the input string 502 to provide the next search key 504. If the search key is not found, it is learned by storing the sequence of symbols (current symbol, next symbol) in the coding table 300.

This allows learning of sequences of symbols, similar to learning the vocabulary of a language by combining the letters of the alphabet. The match index 510 for the longest prefix match is forwarded on encoded string 314 (FIG. 3) stored in the table index field 408 (FIG. 4B) preceded by prefix bit 404 (FIG. 4B) set to '1'. The method for learning a sequence of symbols is described later in conjunction with FIG. 9.

The control logic 500 (FIG. 5) parses the input string 502 dependent on the selected width of the symbol. Initially, the coding table 300 (FIG. 5) stores three entries, the EOS, the flush code and optionally the symbol width change code. The control logic 500 (FIG. 5) selects the next symbol in the input string and searches the coding table 300 (FIG. 5) for the symbol. If the symbol is found, the control logic 500 (FIG. 5) concatenates the symbol with the next symbol in the input string 502 (FIG. 5). The control logic 500 (FIG. 5) continues to concatenate symbols in the input string until it finds a sequence of symbols which is not currently stored in the coding table 300. The control logic 500 (FIG. 5) forwards the index of the longest prefix matching sequence of symbols prefixed by a prefix bit set to '1'.

If a symbol is not stored in the coding table 300 (FIG. 5), the control logic 500 (FIG. 5) forwards the plain symbol for the symbol prefixed by a '0' so that the decoder 312 (FIG. 5) can learn the symbol.

As symbols and sequences of symbols are stored in the coding table 300 (FIG. 5), the control logic 500 (FIG. 5) monitors the number of entries. Each time the number of entries crosses a power of 2 boundary, the control logic 500 (FIG. 5) increments the index width. The control logic 500 (FIG. 5) also monitors the number of entries used in the coding table 300 (FIG. 5) to determine if the coding table 300 (FIG. 5) is full. Upon detecting that the coding table 300 (FIG. 5) is full, the control logic 500 (FIG. 5) initializes the coding table 300 (FIG. 5) by clearing all the entries storing symbols and sequences of symbols and transmits the flush code to the decoder 312 (FIG. 3) so that the decoder 312 (FIG. 3) can initialize its decoding table 320 (FIG. 3).

Alternatively, the control logic 500 (FIG. 5) can monitor the compression rates and decide not to initialize the coding table 300 (FIG. 5) if the compression is efficient. A method for monitoring compression rates is described in, K. Ouaissa, M. Abdat and P. Plume, "Adaptive Limitation of the Dictionary Size in LZW Data Compression", IEEE International Symposium on Information Theory (ISIT'95), Whistler-Canada, September 1995, incorporated herein by reference in its entirety.

Figure 6:
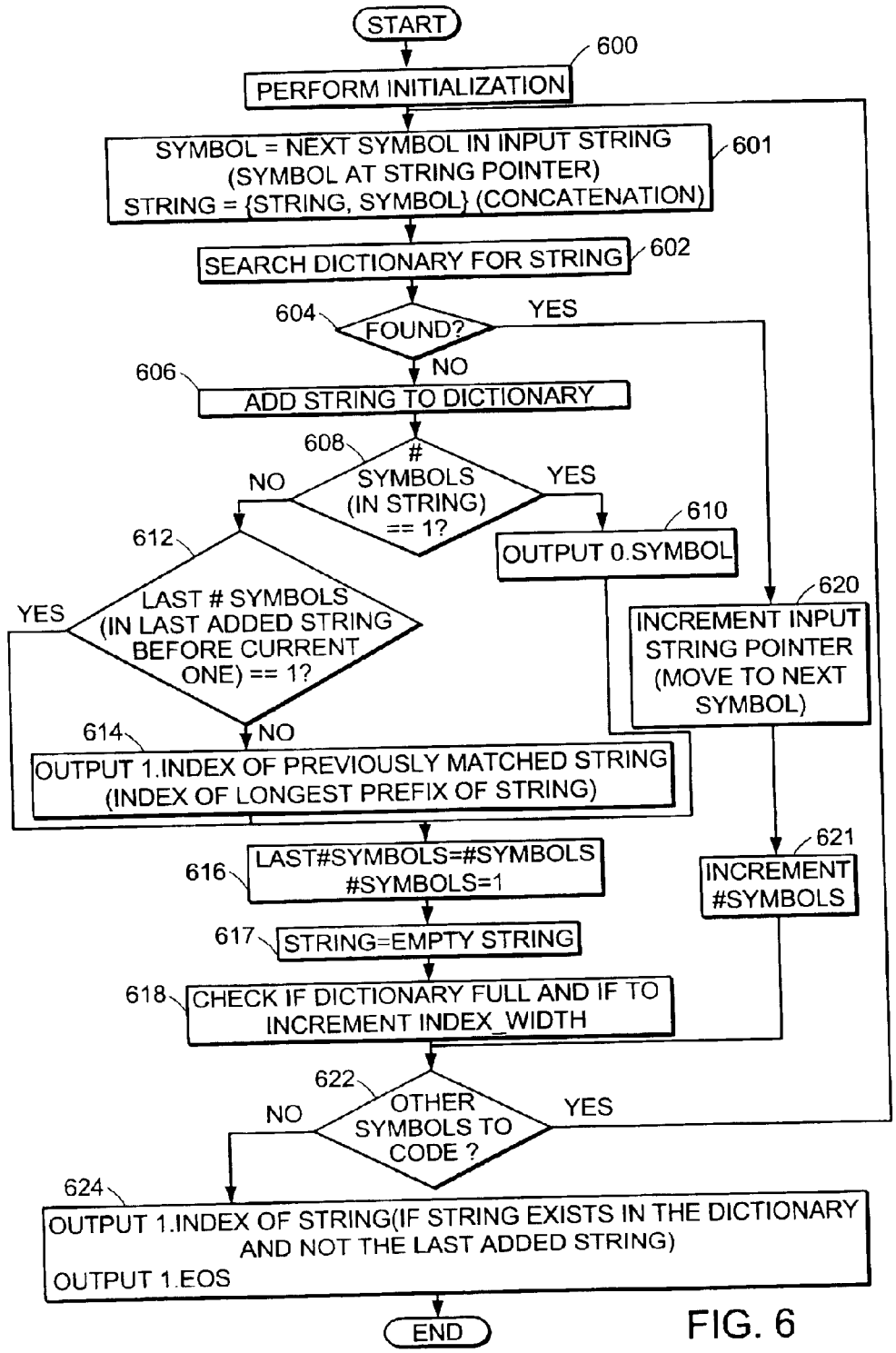
FIG. 6 is a flow graph illustrating the method implemented in the control logic shown in FIG. 5 for encoding the input string.

FIG. 6 is a flow graph illustrating the method implemented in the control logic 500 shown in FIG. 5 for encoding the input string 502. FIG. 6 is described in conjunction with FIG. 5.

At step 600, initialization of the coding table 300 (FIG. 5) and the control logic 500 (FIG. 5) is performed. The dictionary is initialized by storing EOS code '0' in the first entry at index '0', flush code '1' in the second entry at index '1' and optionally the width change code at index '2'. For simplification of presentation, the embodiment described in conjunction with FIG. 6 does not implement the width change code. The embodiment has a fixed symbol width. The index precision register 516 (FIG. 5) is set to '1', the length of the current string 518 (FIG. 5) is set to '1', the number of entries 520 (FIG. 5) stored in the dictionary is set to 2 without the symbol width change code, the last added length 522 (FIG. 5) is set to '1', the input string pointer 514 (FIG. 5) is set to '0' to index the first symbol in the input string 502 (FIG. 5) and the string register 512 is set to empty string (NULL). Processing continues with step 601.

At step 601, the control logic 500 (FIG. 5) selects the next symbol in the input string 502 (FIG. 5) and concatenates the symbol to symbols stored in the string register 512 (FIG. 5) or adds the symbol to the empty string register 512 (FIG. 5). Processing continues with step 602.

At step 602, the control logic 500 (FIG. 5) searches the dictionary for an entry match for the contents of the string register 512 (FIG. 5) by forwarding the contents of the string register 512 (FIG. 5) as the search key 504 (FIG. 5) to the coding table 300 (FIG. 5). The control logic 500 (FIG. 5) also forwards a 'search and learn' instruction on the instruction bus 506 (FIG. 5). Processing continues with step 604.

At step 604, the control logic 500 (FIG. 5) monitors the state of learn 508 (FIG. 5) to determine if the search key 504 (FIG. 5) is being learned because it is not stored in the coding table 300 (FIG. 5). If the state of learn 508 (FIG. 5) indicates that the search key 504 (FIG. 5) is being learned, processing continues with step 606. If the search key 504 (FIG. 5) is found, processing continues with step 620.

At step 606, the search key 504 (FIG. 5) is not found in the coding table 300. The search key 504 (FIG. 5) is stored in the coding table 300 (FIG. 5) at the next sequential index. Processing continues with step 608.

At step 608, the control logic 500 (FIG. 5) checks the number of symbols stored in the string register 512 (FIG. 5) from the value stored in the length of the current string 518 (FIG. 5). If the length of the current string 518 (FIG. 5) is set to '1', processing continues with step 610 to transmit the symbol in plain. If the contents of the length of the current string 518 (FIG. 5) is greater than one, indicating that more than one symbol is stored in the string register 512 (FIG. 5), processing continues with step 612.

At step 610, the control logic 500 (FIG. 5) transmits the plain symbol stored in the string register 512 (FIG. 5) preceded by a prefix bit 404 (FIG. 4A) set to '0' as described in conjunction with FIG. 4A. Processing continues with step 616.

At step 612, the control logic 500 (FIG. 5) checks the last added length 522 (FIG. 5) to determine the length of the last added string to the dictionary 308. If the length of the last string stored is '1'; that is, one symbol, processing continues with step 616. If not, processing continues with step 614.

At step 614, the control logic 500 (FIG. 5) transmits the index of the previously matched string in the table index field 408 of the code word prefixed by a prefix bit 404 (FIG. 4B) set to '1' as described in conjunction with FIG. 4B. The string is already known. Therefore, the index of the previously identified string of symbols is transmitted. Processing continues with step 616.

At step 616, the control logic 500 (FIG. 5) sets the last added length 522 (FIG. 5) to the contents of the length of the current string 518 (FIG. 5). The length of the current string 518 (FIG. 5) is set to '1'. Processing continues with step 617.

At step 617, the control logic 500 (FIG. 5) sets the string register to empty. Processing continues with step 618.

At step 618, the control logic 500 (FIG. 5) checks if the dictionary 308 (FIG. 5) in the coding table 300 (FIG. 5) is full. The control logic 500 (FIG. 5) also checks if the index precision register 516 should be incremented. Step 618 is described later in conjunction with FIG. 7.

At step 620, the control logic 500 (FIG. 5) increments the input string pointer 514 to point to the next symbol in the input string 502 (FIG. 5). Processing continues with step 621.

At step 621, the control logic 500 (FIG. 5) increments the number of symbols stored in the length of current string 518. Processing continues with steps 622.

At step 622, the control logic 500 (FIG. 5) determines from the input string 502 (FIG. 5) if there are more symbols to encode. There are more symbols to decode if the string pointer is not pointing to EOS. If there is a valid symbol, processing continues with step 601. If the pointer points to EOS, processing continues with step 624.

At step 624, the control logic 500 (FIG. 5) has completed the encoding of the input string 502 (FIG. 5). If the string exists in the dictionary 308 (FIG. 3), the control logic transmits the index of the string, preceded by a prefix bit 404 (FIG. 4B) set to '1' on encoded string 314 (FIG. 5). Processing is complete. The control logic 500 (FIG. 5) transmits code '1' for End Of String, preceded by a prefix bit 404 (FIG. 4B) set to '1' on encoded string 314 (FIG. 5) if the string stores EOS.

If the input string 502 (FIG. 5) to compress is not a multiple of the symbol width, a special code is transmitted by the encoder 310 (FIG. 3) to the decoder 312 (FIG. 3), followed by the number of bits remaining in the symbol and then by the plain symbol. For example, if the input string 502 (FIG. 5) is '123456789' and the symbol width is a two characters, the parsing boundaries are 12.34.56.78.9. Thus, the last character >9=is a partial symbol. Therefore '9' is transmitted as 1.special code.9(on 8 bits).8(number of bits to parse).

Figure 7:
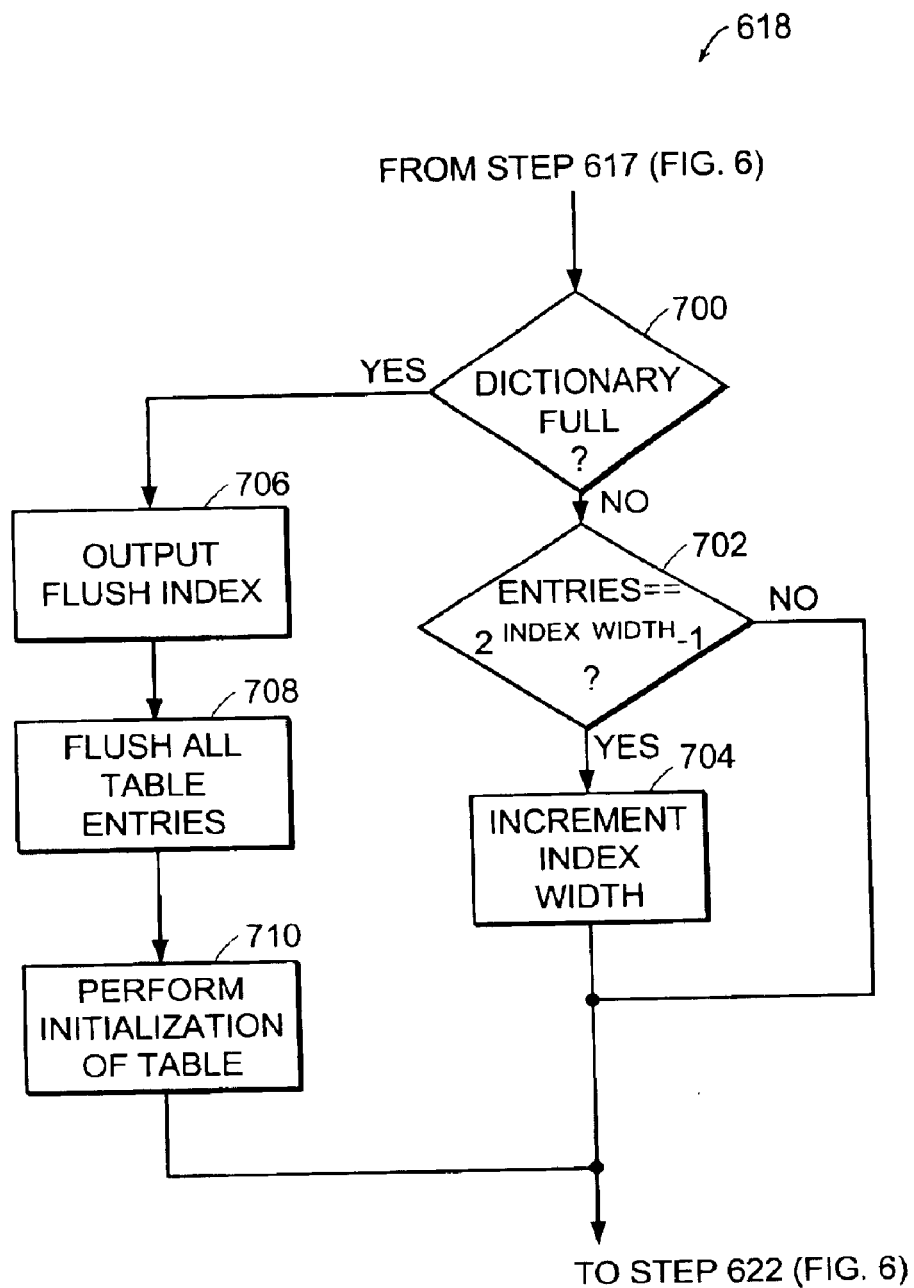
FIG. 7 is a flow graph illustrating the steps performed in step 618 in FIG. 6 for determining index width and the state of the dictionary.

FIG. 7 is a flow graph illustrating the steps performed in step 618 in FIG. 6 for determining if the current index width stored in the index precision register 516 (FIG. 5) is to be incremented and the steps for re-initializing the coding table 300 (FIG. 5) if the dictionary 308 (FIG. 5) is full.

If the dictionary 300 (FIG. 5) is full, the flush code is transmitted to the decoder 312 (FIG. 3) to indicate that a flush operation should be performed. The flush operation clears all entries in the coding table 300 (FIG. 5) and re-initializes the coding table 300 (FIG. 5) by storing the EOS at index '0' and the flush code at index '1' and initializing the index width to '1'. The index width is incremented by one bit each time the number of entries stored in the coding table 300 (FIG. 5) crosses a power of two boundary.

At step 700, the control logic 500 (FIG. 5) determines if the dictionary 308 (FIG. 5) is full from the contents of number of entries 520 (FIG. 5). If the dictionary 308 (FIG. 5) is full, processing continues with step 706. If not, processing continues with step 702.

At step 702, the control logic 500 (FIG. 5) determines the contents of number of entries 520 (FIG. 5) in the coding table 300 (FIG. 5) and if the number of entries in the coding table 300 (FIG. 5) has reached a power of two boundary. The width of the index starts at one bit and is incremented by one each time the index of the last stored entry in the coding table 300 (FIG. 5) reaches a power of two boundary. For example, the index precision register 516 (FIG. 5) stores 3 for a three bit wide index while the dictionary stores less than $2^3$ entries; that is, less than eight entries and is incremented to 4 when 8 entries are stored. If the coding table 300 (FIG. 5) has reached a power of two boundary, processing continues with step 704. If not, processing continues with step 622 (FIG. 6).

At step 704, the coding table 300 (FIG. 5) has reached a power of two boundary, the index precision register 516 (FIG. 5) is incremented. The index precision register 516 (FIG. 5) indicates how many bits are transmitted in the table index field 408 (FIG. 4B). Processing continues with step 622 (FIG. 6).

At step 706, the dictionary 308 (FIG. 5) is full. The control logic 500 (FIG. 5) transmits the flush code stored in the second entry of the dictionary 308 (FIG. 5). The flush code is transmitted on encoded string 314 (FIG. 3) so that the decoder 312 (FIG. 3) knows that the coding table 300 (FIG. 5) is being flushed and can also flush its dictionary 308. Processing continues with step 708.

At step 708, all the table entries in the coding table 300 (FIG. 5) are flushed. Processing continues with step 710.

At step 710, the coding table 300 (FIG. 5) is initialized. The dictionary 308 (FIG. 5) is initialized by storing '0' in the first entry at index '0' and '1' in the second entry at index '1' if the symbol width change is not selected. The index precision register 516 (FIG. 5) is set to one, the number of symbols stored in the string register 512 (FIG. 5) is set to '1', the number of entries 520 (FIG. 5) stored in the dictionary 308 (FIG. 5) is set to 2, the last added length 522 (FIG. 5) is set to '1' and the input string pointer 514 (FIG. 5) is set to the index of the position in the current symbol. Processing continues with step 622 (FIG. 6).

Figure 8A:
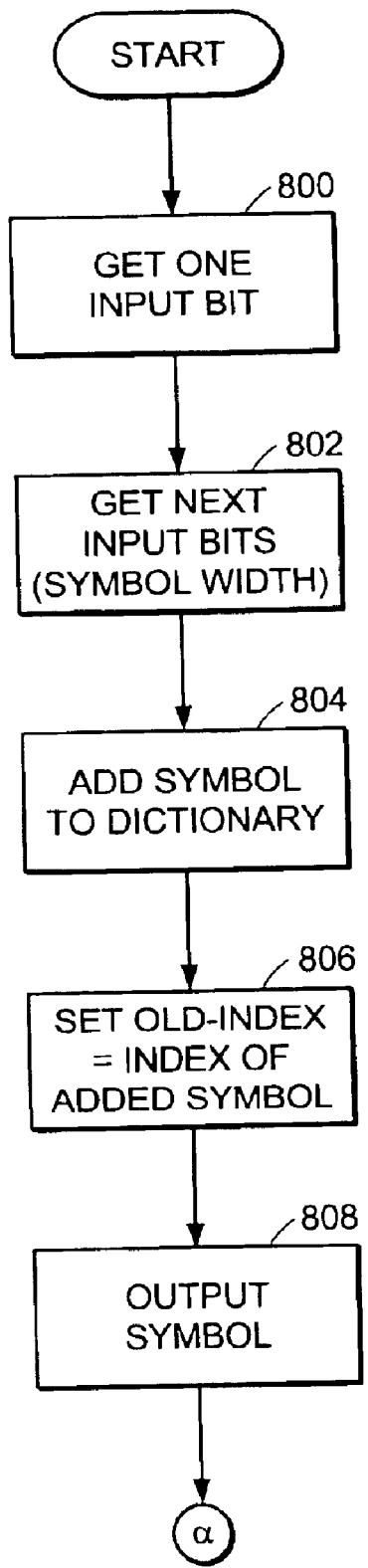
FIGS. 8A–8B is a flow graph illustrating the method implemented in the decoder shown in FIG. 3 for decoding the received encoded string.
Figure 8B:
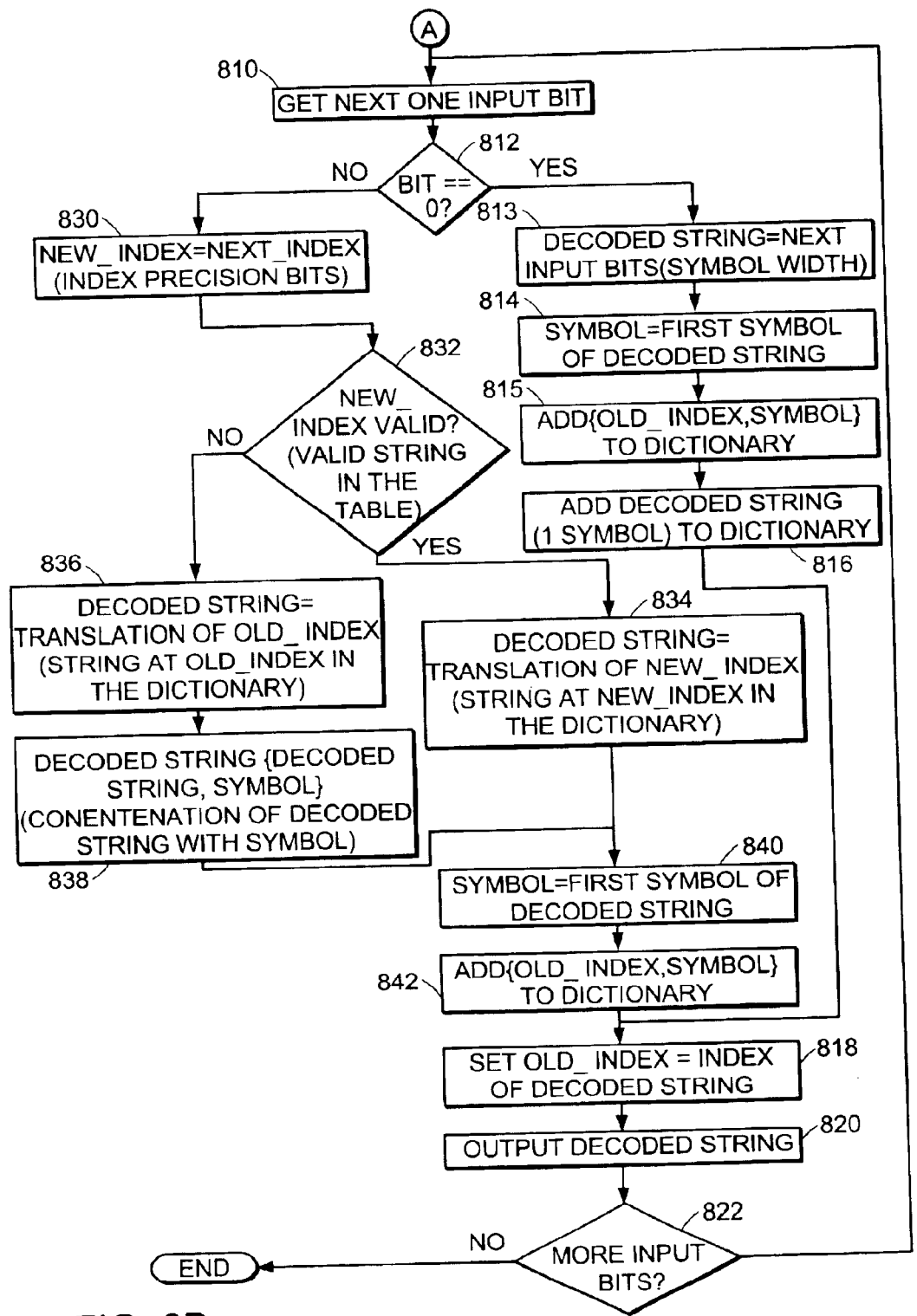

FIGS. 8A–8B is a flow graph illustrating the method implemented in the decoder 312 shown in FIG. 3 for decoding the received encoded string 314 (FIG. 3). In order to decode the received code words, the decoder 312 (FIG. 3) includes a plurality of registers. The registers include an old_index register for storing the index of the last decoded string, a new_index register for storing the index, a decoded string register for storing the current decoded string (in plain) and a symbol that is equal to the first symbol of the current decoded string.

The decoder 312 (FIG. 3) looks at the first bit received to determine if a symbol or an index is being received. The decoder 312 (FIG. 3) decodes the received index by replacing the index with the sequence of learned symbols stored in a decoding table 320 (FIG. 3). The decoder 312 (FIG. 3) learns a received plain symbol by storing the plain symbol at the next sequential index in the decoding table 320 (FIG. 3).

At step 800, the decoder 312 (FIG. 3) extracts the first bit from the encoded string 314 (FIG. 3). Initially, the dictionary 308 (FIG. 3) in the decoder stores two entries if the symbol width change is not selected. The decoder 312 (FIG. 3) learns symbols and populates the dictionary 308 (FIG. 3) from symbols received in the encoded string 314 (FIG. 3). The first bit in the first encoded string 314 (FIG. 3) received by the decoder 312 (FIG. 3), indicates that the first code word includes a plain symbol field 406 (FIG. 4A) storing a plain symbol to be learned by the decoder 312 (FIG. 3). Processing continues with step 802.

At step 802, the first bit received is set to '0' indicating that the prefix bit 404 precedes a symbol stored in the plain symbol field 406 to be learned by the decoder. The decoder 312 (FIG. 3) extracts the plain symbol from the encoded string 314 (FIG. 3). The number of bits extracted is dependent on the selected width of the symbol. For example, if the selected symbol width is 16 bits, the decoder 312 (FIG. 3) gets the next 16 bits in the encoded input string 314 (FIG. 3). Processing continues with step 804.

At step 804, the plain symbol is added to the dictionary 308 (FIG. 3) in the decoding table 320 (FIG. 3) at the next sequential index in the dictionary 308 (FIG. 3). Processing continues with step 806.

At step 806, an old_index register is set to the index of the added symbol in the dictionary 308 (FIG. 3). Processing continues with step 808.

At step 808, the symbol received in the encoded string 314 (FIG. 3) is output by the decoder as decoded output string 304 (FIG. 3). Processing continues with step 810.

At step 810, the decoder 312 (FIG. 3) gets the next bit from the encoded string 314 (FIG. 3) to determine if the code word includes plain symbol or an index. Processing continues with step 812.

At step 812, the decoder 312 (FIG. 3) examines the next bit received in the encoded string 314 (FIG. 3) to determine if it is set to '1' for a table index 408 (FIG. 4B) or '0' for plain symbol 406 (FIG. 4A). If the next bit is set to '0', processing continues with step 813 to process the plain symbol 406 (FIG. 4A). If the next bit is set to '1', processing continues with step 830 to process the table index 408 (FIG. 4B).

At step 813, the decoder 312 (FIG. 3) gets the next bits from the encoded string 314 (FIG. 3). The number of next bits are dependent on the width of the symbol. The decoder 312 (FIG. 3) stores the bits in the decoded string register. Processing continues with step 814.

At step 814, the decoder 312 (FIG. 3) stores the first symbol of the decoded string (the symbol itself) in a symbol register. Processing continues with step 815.

At step 815, the decoder 312 (FIG. 3) stores the string obtained by the concatenation of the string at old_index and the decoded symbol in the next sequential index in the dictionary 308 (FIG. 3). Each time a string or symbol is added to the dictionary 308 (FIG. 3), the decoder 312 (FIG. 3) checks that the number of entries in the dictionary 308 (FIG. 3) has not reached a power of two. If the number of entries in the dictionary 308 (FIG. 3) has reached a power of two, the decoder 312 (FIG. 3) increments the index precision as has already been described for the encoder in conjunction with FIG. 7. Unlike the encoder 310 (FIG. 3), the decoder 312 (FIG. 3) does not need to check for a full dictionary 308 (FIG. 3) because the full state is indicated by the flush code forwarded by the encoder 310 (FIG. 3). Processing continues with step 816.

At step 816, the decoder 312 (FIG. 3) stores the decoded symbol in the next sequential index in the dictionary 308 (FIG. 3). Processing continues with step 818.

At step 818, the index of the decoded symbol or string of symbols is stored in the old_index register. Processing continues with step 820.

At step 820, the decoded string stored in the string register is output by the decoder 312 (FIG. 3). Processing continues with step 822.

At step 822, the decoder 312 (FIG. 3) determines if there are more bits in the encoded string 314 (FIG. 3) to be decoded. If so, processing continues with step 810. If not, processing is complete.

At step 830, a new_index register is set to the contents of the next index in the table index field 408 (FIG. 4B). The number of bits stored in the new index register is dependent on the index precision selected by the encoder. Processing continues with step 832.

At step 832, the decoder 312 (FIG. 3) examines the contents of the new index register. The decoder 312 (FIG. 3) checks if the received index is an EOS or flush code. If the received index is a flush code, the table is initialized as has been described earlier in conjunction with FIG. 7 for the encoder 310 (FIG. 3). If the received index is EOS, processing is complete. If the received index is not EOS or flush code the decoder determines if the new index is valid. If the new index is valid, processing continues with step 834. If not, processing continues with step 836.

At step 834, the decoder 312 (FIG. 3) stores the translation of the new index in the decoded string register from the dictionary. Processing continues with step 840.

At step 836, the new index is not valid. The decoder 312 (FIG. 3) stores the translation of the old index in the decoded string register. Processing continues with step 838.

At step 838, the decoder 312 (FIG. 3) sets the decoded string to be equal to the concatenation of decoded string and symbol. Processing continues with step 840.

At step 840, the decoder 312 (FIG. 3) sets the contents of a symbol register to the first symbol of the decoded string. Processing continues with step 842.

At step 842, the string of symbols stored at the old_index in the dictionary 308 (FIG. 5) is concatenated with the symbol and the resulting string is stored in the dictionary at the next sequential index. Processing continues with step 818.

Figure 9:
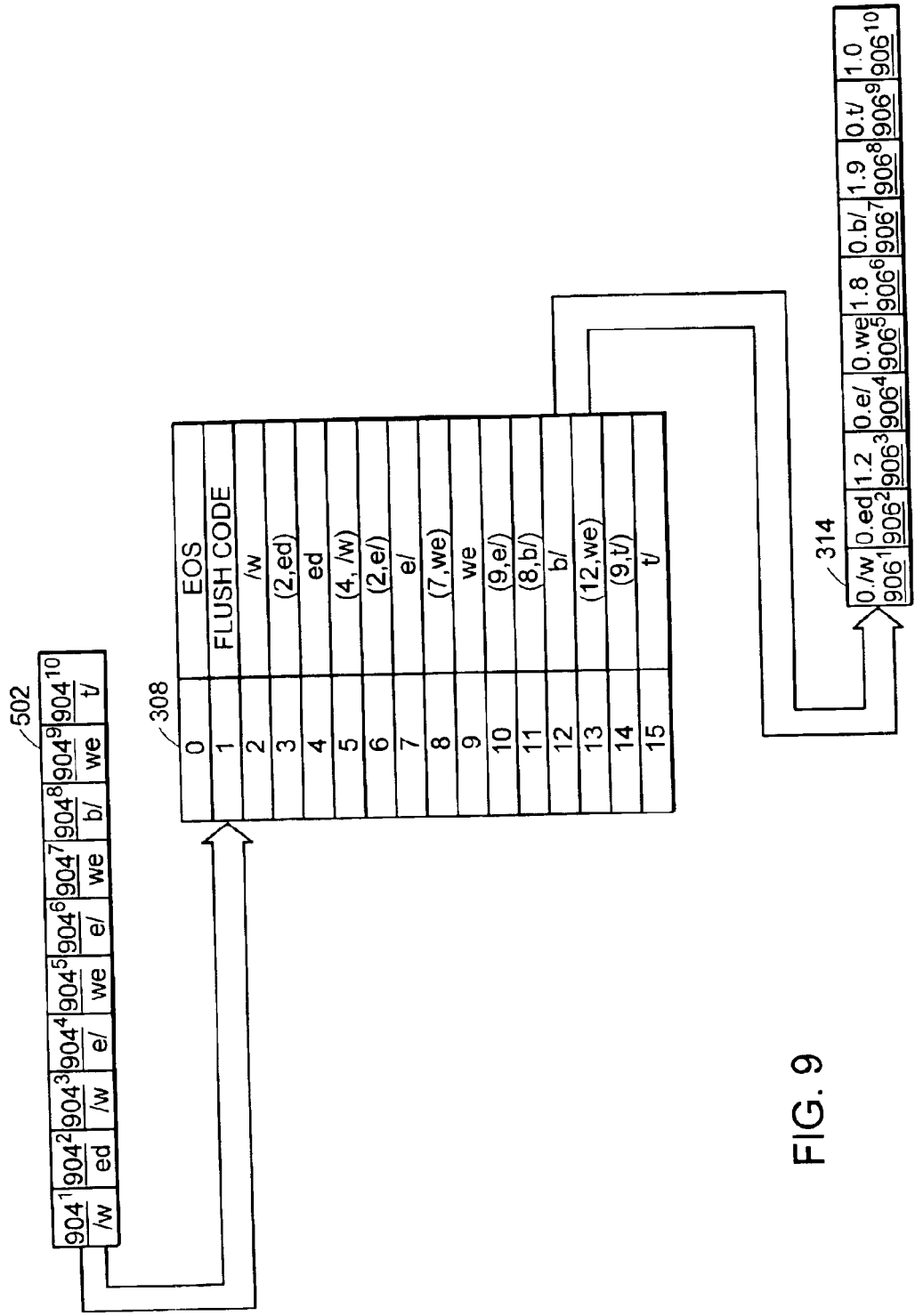
FIG. 9 illustrates the input string, the contents of the dictionary in the encoder after processing the input string, and an encoded string.

FIG. 9 illustrates, the input string, the contents of the dictionary 308 in the encoder after processing input string 502 and an encoded string. FIG. 9 is described in conjunction with FIGS. 5 and 6.

At step 600 (FIG. 6), the dictionary 308 is initialized by storing EOS at index 0 and Flush code at index 1. In the embodiment shown, the symbol width is fixed at two characters (16 bits). However, the symbol width is not limited to 16 bits and can be dynamically modified as has already been described. The input string 502 includes a plurality of symbols $904^1$–$904^{10}$. The first 16-bit wide symbol $904^1$ in the input string 502 is '/w' and the last 16-bit wide symbol $904^{10}$ in the input string is 't/'.

At step 601 (FIG. 6), the control logic 500 (FIG. 5) parses the input string 502 and extracts the first symbol $904^1$ '/w' from the input string 502. The symbol to be extracted from the input string 502 is dependent on the contents of the string pointer register 514 (FIG. 5). Initially, the contents of the string pointer register 514 (FIG. 5) points to the first symbol $904^1$ in the input string 502 and the string register 512 (FIG. 5) is empty. The control logic 500 (FIG. 5) concatenates the symbol $904^1$ with the contents of the string register 512 (FIG. 5) that is empty.

At step 602 (FIG. 6), the control logic 500 (FIG. 5) forwards the contents of the string register 512 (FIG. 5) as the search key 504 (FIG. 5) to the coding table 300 (FIG. 5). The coding table 300 (FIG. 5) searches the dictionary 308 for the symbol $904^1$. At step 604 (FIG. 6), the symbol $904^1$ is not found in the dictionary 308 (FIG. 5). At step 606 (FIG. 6), the coding table 300 (FIG. 5) learns the symbol $904^1$ by storing the symbol $904^1$ at the next sequential index, index 2 in the dictionary 308 and indicates that the symbol $904^1$ is learned through learn 508. At step 608 (FIG. 6), the number of symbols stored in the string register 502 (FIG. 5) is '1', and thus processing continues with step 610 (FIG. 6). At step 610 (FIG. 6), the control logic 500 (FIG. 5) forwards code word $906^1$ on encoded string 314 (FIG. 3) so that the decoder 312 (FIG. 3) can learn the symbol $904^1$. Code word $906^1$ includes plain symbol $904^1$ preceded by a prefix bit 404 (FIG. 4A) set to '0' as described in conjunction with FIG. 4A.

After plain symbol $904^1$ is forwarded, the control logic 500 (FIG. 5) modifies various registers in steps 616 (FIG. 6), 617 (FIG. 6) and 618 (FIG. 6). At step 616 (FIG. 6), the control logic 500 (FIG. 5) sets the last added length 522 (FIG. 5) to the contents of the length of the current string 518 (FIG. 5) and sets the length of the current string 518 (FIG. 5) to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6) to continue parsing the input string 502.

At step 601 (FIG. 6), the contents of the input string pointer register 514 (FIG. 5) still point to first symbol $904^1$ in the input string 502 (FIG. 5). The control logic 500 (FIG. 5) extracts the first symbol $904^1$ again and concatenates it with the contents of the string register 512 (FIG. 5) that is empty. At step 602 (FIG. 6), the control logic 500 (FIG. 5) forwards the contents of the string register 512 (FIG. 5) as the search key 504 (FIG. 5) to the coding table 300 (FIG. 5). The coding table 300 (FIG. 5) searches the dictionary 308 for the symbol $904^1$. At step 604 (FIG. 6), the symbol $904^1$ is found in the dictionary 308 (FIG. 5) because it was stored in the dictionary 308 (FIG. 5) in the previous iteration through steps 601–622 (FIG. 6).

Having found the symbol $904^1$, at step 620 (FIG. 6), the control logic 500 (FIG. 5) increments the input string pointer 514 to point to the next symbol $904^2$ in the input string 502 (FIG. 5). At step 621 (FIG. 6), the control logic 500 (FIG. 5) increments the number of symbols stored in the string register 512 (FIG. 5). At step 622 (FIG. 6), the control logic 500 (FIG. 5) determines from the input string 502 (FIG. 5) that there are more symbols to encode. Processing continues with step 601 (FIG. 6) with the input string pointer pointing to the second symbol $904^2$ 'ed' in the input string 502 and the string register 512 (FIG. 5) storing the first symbol $904^1$ '/w'.

At step 601(FIG. 6), the control logic 500 (FIG. 5) concatenates symbol $904^1$ with the next symbol $904^2$ in the input string 502. At step 602 (FIG. 6), the control logic 500 (FIG. 5) forwards the concatenated string '/wed', as the search key 504 to the coding table 300. At step 604 (FIG. 6), the sequence of symbols '/wed' is not found in the coding table 300. At step 606 (FIG. 6), the sequence of symbols '/wed' is learned by storing '/wed'at the next sequential index, index 3 in the dictionary 308. The sequence of symbols '/wed' is not stored in plain. Instead, the sequence of symbols '/wed' is stored with an index referencing its prefix. The prefix for the sequence of symbols '/wed' is '/w' which is stored at index 2. The sequence of symbols '/wed' is stored at index 3 as (2, ed) with '/w' stored as a table index 2 and 'ed' stored in plain. At step 608 (FIG. 6), the number of symbols in the string register 512 (FIG. 5) is two. Thus, at step 612 (FIG. 6), the control logic 500 (FIG. 5) determines that the last number of symbols in the last added string is one and at step 616 (FIG. 6), the control logic 500 (FIG. 5) sets the last added length 522 (FIG. 5) to the contents of the length of the current string 518 (FIG. 5) and sets the length of the current string 518 (FIG. 5) to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

The contents of the string pointer register 514 (FIG. 5) points to symbol $904^2$. The string register 512 (FIG. 5) is empty. At step 601 (FIG. 6), the control logic concatenates the next symbol $904^2$ 'ed' in the input string 502 (FIG. 5) with the contents of the string register 512 (FIG. 5) which is empty. At step 602 (FIG. 6), the control logic 500 forwards the contents of the string register 512 (FIG. 5), that is, the next symbol $904^2$ 'ed' in the input string 502 as the search key 504 (FIG. 5) to the coding table 300. The coding table 300 (FIG. 5) searches the dictionary 308 for the symbol $904^2$. At step 604 (FIG. 6), the symbol $904^2$ is not found. At step 606 (FIG. 6), the coding table 300 (FIG. 5) learns the symbol $904^2$ by storing the symbol $904^2$ at index 4 in the dictionary 308 and indicates that the symbol $904^2$ is being learned through learn 508. At step 608 (FIG. 6), the number of symbols stored is '1', thus processing continues with step 610 (FIG. 6). At step 610 (FIG. 6), the control logic 500 (FIG. 5) forwards code word $906^2$ on encoded string 314 (FIG. 3) so that the decoder can learn the symbol. Code word $906^2$ includes plain symbol $904^2$ preceded by a prefix bit 404 (FIG. 4A) set to '0' as described in conjunction with FIG. 4A.

After plain symbol $904^2$ is forwarded, the control logic 500 (FIG. 5) modifies various registers. At step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

At step 601 (FIG. 6), the contents of the input string pointer register 514 (FIG. 5) still point to symbol $904^2$ in the input string 502 (FIG. 5). The control logic 500 concatenates the symbol $904^2$ with the contents of the string register 512 (FIG. 5) which is empty. At step 602 (FIG. 6), the control logic 500 (FIG. 5) forwards the contents of the string register 512 (FIG. 5) as the search key 504 (FIG. 5) to the coding table 300 (FIG. 5). The coding table 300 (FIG. 5) searches the dictionary 308 for the symbol $904^2$. At step 604 (FIG. 6), the symbol $904^2$ is found in the dictionary 308 (FIG. 5) because it was stored in the dictionary 308 (FIG. 5) in the previous iteration through steps 601–622 (FIG. 6).

At step 620 (FIG. 6), the control logic 500 (FIG. 5) increments the input string pointer 514 to point to the next symbol $904^3$ in the input string 502 (FIG. 5). At step 621 (FIG. 6), the control logic 500 FIG. 5) increments the number of symbols stored in the string register 512 (FIG. 5). At step 622 FIG. 6), the control logic 500 (FIG. 5) determines from the input string 502 (FIG. 5) that there are more symbols to encode. Processing continues with step 601 (FIG. 6) with the input string pointer pointing to the next symbol $904^3$ '/w' in the input string and the string register storing symbol $904^2$ 'ed'.

At step 601 (FIG. 6), the control logic 500 (FIG. 5) concatenates symbol $904^2$ stored in the string register 512 (FIG. 5) with the next symbol $904^3$ in the input string 502. At step 602 (FIG. 6), the control logic 500 (FIG. 5) forwards the sequence of symbols 'ed/w' as the search key 504 to the coding table 300. The coding table 300 searches the dictionary 308 for the sequence of symbols 'ed/w'.

At step 604 (FIG. 6), the sequence of symbols 'ed/w' is not found. At step 606 (FIG. 6), the sequence of symbols 'ed/w' is learned by storing the sequence of symbols at index 5 in the dictionary 308. The sequence of symbols is not stored in plain. Instead, the sequence of symbols 'ed/w'is stored with index 4 referencing its prefix because symbol 'ed' is stored at index 4. The sequence of symbols 'ed/w' is stored at index 5 as (4, /w), with 'ed' stored as index 4 and '/w' stored in plain. The number of symbols in the string register 512 (FIG. 5) is two. Thus, at step 612 (FIG. 6), the control logic 500 (FIG. 5) determines that the last number of symbols in the last added string is one and at step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

The contents of the string pointer register 514 (FIG. 5) points to symbol $904^3$. The string register 512 (FIG. 5) is empty. At step 601 (FIG. 6), the control logic 500 (FIG. 5) concatenates the next symbol $904^3$ '/w' in the input string 502 (FIG. 5) with the contents of the string register 512 (FIG. 5). At step 602 FIG. 6), the control logic 500 forwards the contents of the string register 512 (FIG. 5), that is, the next symbol $904^3$ '/w' in the input string 502 as the search key 504 (FIG. 5) to the coding table 300. The coding table 300 (FIG. 5) searches the dictionary 308 for the symbol $904^3$. At step 604 (FIG. 6), the symbol $904^3$ is found in the dictionary 308 (FIG. 5) at index 2 because it was stored in the dictionary 308 (FIG. 5) in a previous iteration through steps 601–622 (FIG. 6).

At step 620 (FIG. 6), the control logic 500 (FIG. 5) increments the input string pointer 514 to point to the next symbol $904^4$ in the input string 502 (FIG. 5). At step 621 (FIG. 6), the control logic 500 (FIG. 5) increments the number of symbols stored in the string register 512 (FIG. 5) to two. At step 622 (FIG. 6), the control logic 500 (FIG. 5) determines from the input string 502 (FIG. 5) that there are more symbols to encode. Processing continues with step 601 (FIG. 6) with the input string pointer 514 (FIG. 5) pointing to the next symbol $904^4$ 'e/' in the input string and the string register 512 (FIG. 5) storing symbol $904^3$ '/w'.

At step 601 (FIG. 6), the control logic 500 (FIG. 5) concatenates symbol $904^3$ with the next symbol $904^4$ in the input string 502. At step 602 (FIG. 6), the control logic 500 (FIG. 5) forwards the sequence of symbols '/we/' as the search key 504 to the coding table 300. The coding table 300 searches the dictionary 308 for the sequence of symbols '/we/'. At step 604 (FIG. 6), the sequence of symbols '/we/' is not found. At step 606 (FIG. 6), the sequence of symbols '/we/' is learned by storing the sequence of symbols at index 6 in the dictionary 308. The sequence of symbols is not stored in plain. Instead, the sequence of symbols '/we/' is stored with index 1 referencing its prefix because symbol '/w' is stored at index 2. The sequence of symbols '/we/' is stored at index 6 as (2, e/), with '/w' stored as index 2 and 'e/' stored in plain. The number of symbols in the string register 512 (FIG. 5) is two. Thus, at step 612 (FIG. 6), the control logic 500 (FIG. 5) determines that the last number of symbols in the last added string is two and at step 614 (FIG. 6), the control logic 500 (FIG. 5) forwards code word $906^3$ on encoded string 314 (FIG. 3). Code word $906^3$ includes index 2 preceded by '1' as described in conjunction with FIG. 4B.

At step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617, the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

The contents of the string pointer register 514 (FIG. 5) points to symbol $904^4$ 'e/'. The string register 512 (FIG. 5) is empty. At step 601 (FIG. 6), the control logic concatenates the next symbol $904^4$ 'e/' in the input string 502 (FIG. 5) with the contents of the string register 512 (FIG. 5) which is empty. At step 602 (FIG. 6), the control logic 500 forwards the contents of the string register 512 (FIG. 5), that is, the next symbol $904^4$ 'e/' in the input string 502 as the search key 504 (FIG. 5) to the coding table 300. The coding table 300 (FIG. 5) searches the dictionary 308 for the symbol $904^4$. At step 604 (FIG. 6), the symbol $904^4$ is not found. At step 606 (FIG. 6), the coding table 300 (FIG. 5) learns the symbol $904^4$ by storing the symbol $904^4$ at index 7 in the dictionary 308 and indicates that the symbol $904^4$ is being learned through learn 508. At step 608 (FIG. 6), the number of symbols stored is '1', thus processing continues with step 610 (FIG. 6). At step 610 (FIG. 6), the control logic 500 (FIG. 5) forwards code word $906^4$ on encoded string 314 (FIG. 3) so that the decoder can learn the symbol. Code word $906^4$ includes plain symbol $904^4$ preceded by a prefix bit 404 (FIG. 4A) set to '0' as described in conjunction with FIG. 4A.

After plain symbol $904^4$ is forwarded, the control logic 500 (FIG. 5) modifies various registers. At step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617, the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

At step 601 (FIG. 6), the contents of the input string pointer register 514 still point to symbol $904^4$ in the input string 502 (FIG. 5). The control logic 500 concatenates the symbol $904^4$ with the contents of the string register 512 (FIG. 5) which is empty. At step 602 (FIG. 6), the control logic 500 (FIG. 5) forwards the contents of the string register 512 (FIG. 5) as the search key 504 (FIG. 5) to the coding table 300 (FIG. 5). The coding table 300 (FIG. 5) searches the dictionary 308 for the symbol $904^4$. At step 604 (FIG. 6), the symbol $904^4$ is found in the dictionary 308 (FIG. 5) because it was stored in the dictionary 308 (FIG. 5) in the previous iteration through steps 601–622 (FIG. 6).

At step 620 (FIG. 6), the control logic 500 (FIG. 5) increments the input string pointer 514 to point to the next symbol $904^5$ in the input string 502 (FIG. 5). At step 621 (FIG. 6), the control logic 500 (FIG. 5) increments the number of symbols to two. At step 622 (FIG. 6), the control logic 500 (FIG. 5) determines from the input string 502 (FIG. 5) that there are more symbols to encode. Processing continues with step 601 (FIG. 6) with the input string pointer pointing to the next symbol $904^5$ 'we' in the input string and the string register storing symbol $904^4$ 'e/'.

At step 601 (FIG. 6), the control logic 500 (FIG. 5) concatenates symbol $904^4$ with the next symbol $904^5$ in the input string 502. At step 602 (FIG. 6), the control logic 500 (FIG. 5) forwards the sequence of symbols 'e/we' as the search key 504 to the coding table 300. The coding table 300 searches the dictionary 308 for the sequence of symbols 'e/we'. At step 604 (FIG. 6), the sequence of symbols 'e/we' is not found. At step 606 (FIG. 6), the sequence of symbols 'e/we' is learned by storing the sequence of symbols at index 8 in the dictionary 308. The sequence of symbols is not stored in plain. Instead, the sequence of symbols 'e/we' is stored with index 7 referencing its prefix because symbol 'e/' is stored at index 7. The sequence of symbols 'e/we' is stored at index 8 as (7, we), with 'e/' stored as index 7 and 'we' stored in plain. The number of symbols in the string register 512 (FIG. 5) is two. Thus, at step 612 (FIG. 6), the control logic 500 (FIG. 5) determines that the last number of symbols in the last added string is one and at step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

The contents of the string pointer register 514 (FIG. 5) point to symbol $904^5$. The string register 512 (FIG. 5) is empty. At step 601 (FIG. 6), the control logic concatenates the next symbol $904^5$ 'we' in the input string 502 (FIG. 5) with the contents of the string register 512 (FIG. 5) which is empty. At step 602 (FIG. 6), the control logic 500 forwards the contents of the string register 512 (FIG. 5), that is, the next symbol $904^5$ 'we' in the input string 502 as the search key 504 (FIG. 5) to the coding table 300. The coding table 300 (FIG. 5) searches the dictionary 308 for the symbol $904^5$. At step 604 (FIG. 6), the symbol $904^5$ is not found. At step 606 (FIG. 6), the coding table 300 (FIG. 5) learns the symbol $904^5$ by storing the symbol $904^5$ at index 9 in the dictionary 308 and indicates that the symbol $904^5$ is being learned through learn 508. At step 608 (FIG. 6), the number of symbols stored is '1', thus processing continues with step 610 (FIG. 6). At step 610 (FIG. 6), the control logic 500 (FIG. 5) forwards code word $906^5$ on encoded string 314 (FIG. 3) so that the decoder can learn the symbol. Code word $906^5$ includes plain symbol $904^5$ preceded by a prefix bit 404 (FIG. 4A) set to '0' as described in conjunction with FIG. 4A.

After plain symbol $904^5$ is forwarded, the control logic 500 (FIG. 5) modifies various registers. At step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

At step 601 (FIG. 6), the contents of the input string pointer register 514 still point to symbol $904^5$ in the input string 502 (FIG. 5). The control logic 500 concatenates the symbol $904^5$ with the contents of the string register 512 (FIG. 5) which is empty. At step 602 (FIG. 6), the control logic 500 (FIG. 5) forwards the contents of the string register 512 (FIG. 5) as the search key 504 (FIG. 5) to the coding table 300 (FIG. 5). The coding table 300 (FIG. 5) searches the dictionary 308 for the symbol $904^5$. At step 604 (FIG. 6), the symbol $904^5$ is found in the dictionary 308 (FIG. 5) because it was stored in the dictionary 308 (FIG. 5) in the previous iteration through steps 601–622.

At step 620 (FIG. 6), the control logic 500 (FIG. 5) increments the input string pointer 514 to point to the next symbol $904^6$ in the input string 502 (FIG. 5). At step 621 (FIG. 6), the control logic 500 (FIG. 5) increments the number of symbols to two. At step 622 (FIG. 6), the control logic 500 (FIG. 5) determines from the input string 502 (FIG. 5) that there are more symbols to encode. Processing continues with step 601 (FIG. 6) with the input string pointer pointing to the next symbol $904^6$ '/e' in the input string and the string register storing symbol $904^5$ 'we'.

At step 601 (FIG. 6), the control logic 500 (FIG. 5) concatenates symbol $904^5$ with the next symbol $904^6$ in the input string 502. At step 602 (FIG. 6), the control logic 500 (FIG. 5) forwards the sequence of symbols 'wee/' as the search key 504 to the coding table 300. The coding table 300 searches the dictionary 308 for the sequence of symbols 'wee/'. At step 604 (FIG. 6), the sequence of symbols 'wee/' is not found. At step 606 (FIG. 6), the sequence of symbols 'wee/' is learned by storing the sequence of symbols at index 10 in the dictionary 308. The sequence of symbols is not stored in plain. Instead, the sequence of symbols 'wee/' is stored with index 9 referencing its prefix because symbol 'we' is stored at index 9. The sequence of symbols 'wee/' is stored at index 10 as (9, e/), with 'we' stored as index 9 and 'e/' stored in plain. The number of symbols in the string register 512 (FIG. 5) is two. Thus, at step 612 (FIG. 6), the control logic 500 (FIG. 5) determines that the last number of symbols in the last added string is one and at step 616, the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

The contents of the string pointer register 514 (FIG. 5) point to symbol $904^6$. The string register 512 (FIG. 5) is empty. At step 601 (FIG. 6), the control logic concatenates the next symbol $904^6$ 'e/' in the input string 502 (FIG. 5) with the contents of the string register 512 (FIG. 5) which is empty. At step 602 (FIG. 6), the control logic 500 forwards the contents of the string register 512 (FIG. 5), that is, the next symbol $904^6$ 'e/' in the input string 502 as the search key 504 (FIG. 5) to the coding table 300. The coding table 300 (FIG. 5) searches the dictionary 308 for the symbol 904$^6$. At step 604 (FIG. 6), the symbol 904$^6$ is found at index 7.

At step 620 (FIG. 6), the control logic 500 (FIG. 5) increments the input string pointer 514 to point to the next symbol 904$^7$ in the input string 502 (FIG. 5). At step 621 (FIG. 6), the control logic 500 (FIG. 5) increments the number of symbols. At step 622 (FIG. 6), the control logic 500 (FIG. 5) determines from the input string 502 (FIG. 5) that there are more symbols to encode. Processing continues with step 601 (FIG. 6) with the input string pointer pointing to the next symbol 904$^7$ 'we' in the input string and the string register storing symbol 904$^6$ 'e/'.

At step 601 (FIG. 6), the control logic 500 (FIG. 5) concatenates symbol 904$^6$ with the next symbol 904$^7$ in the input string 502. At step 602 (FIG. 6), the control logic 500 (FIG. 5) forwards the sequence of symbols 'e/we' as the search key 504 to the coding table 300. The coding table 300 searches the dictionary 308 for the sequence of symbols 'e/we'. At step 604 (FIG. 6), the sequence of symbols 'e/we' is found at index 8. At step 620 (FIG. 6), the control logic 500 (FIG. 5) increments the input string pointer 514 to point to the next symbol 904$^8$ in the input string 502 (FIG. 5). At step 621 (FIG. 6), the control logic 500 (FIG. 5) increments the number of symbols to three. At step 622 (FIG. 6), the control logic 500 (FIG. 5) determines from the input string 502 (FIG. 5) that there are more symbols to encode. Processing continues with step 601 (FIG. 6) with the input string pointer 514 (FIG. 5) pointing to the next symbol 904$^8$ 'b/' in the input string and the string register 512 (FIG. 5) storing the symbols 'e/we'.

At step 601, the control logic 500 (FIG. 5) concatenates symbol 904$^8$ with the contents of the string register 512 (FIG. 5). At step 602 (FIG. 6), the control logic 500 (FIG. 5) forwards the contents of the string register 512 (FIG. 5) 'e/web/' as the search key 504 to the coding table 300. The coding table searches the dictionary 308 for the sequence of symbols 'e/web/'. At step 604 (FIG. 6), the sequence of symbols 'e/web/' is not found. At step 606 (FIG. 6), the sequence of symbols 'e/web/' is learned by storing the sequence of symbols at index 11 in the dictionary 308. The sequence of symbols is not stored in plain. Instead, the sequence of symbols 'e/web/' is stored with index 8 referencing its prefix because symbol 'e/we' is stored at index 8. The sequence of symbols 'e/web/' is stored at index 11 as (8, b/), with 'e/we' already stored as index 8 and 'b/' stored in plain. The number of symbols in the string register 512 (FIG. 5) is three. Thus, at step 612 (FIG. 6), the control logic 500 (FIG. 5) determines that the last number of symbols in the last added string is not one and, at step 614 (FIG. 6), the control logic 500 (FIG. 5) forwards code word 906$^6$ on encoded string 314 (FIG. 3). Code word 906$^6$ includes the index 8 at which the string of symbols 'e/we' is stored at, preceded by '1' as described in conjunction with FIG. 4B.

At step 622 (FIG. 6), the control logic 500 (FIG. 5) determines that there is another valid symbol (not EOS) in the input string 502 and processing continues with step 601 (FIG. 6).

The contents of the string pointer register 514 (FIG. 5) point to symbol 904$^8$. The string register 512 (FIG. 5) is empty. At step 601 (FIG. 6), the control logic concatenates the next symbol 904$^8$ 'b/' in the input string 502 (FIG. 5) with the contents of the string register 512 (FIG. 5) which is empty. At step 602 (FIG. 6), the control logic 500 forwards the contents of the string register 512 (FIG. 5), that is, the next symbol 904$^8$ 'b/' in the input string 502 as the search key 504 (FIG. 5) to the coding table 300. The coding table 300 (FIG. 5) searches the dictionary 308 for the symbol 904$^8$. At step 604 (FIG. 6), the symbol 904$^8$ is not found. At step 606 (FIG. 6), the coding table 300 (FIG. 5) learns the symbol 904$^8$ by storing the symbol 904$^8$ at index 12 in the dictionary 308 and indicates that the symbol 904$^8$ is being learned through learn 508. At step 608 (FIG. 6), the number of symbols stored is '1', thus processing continues with step 610 (FIG. 6). At step 610 (FIG. 6), the control logic 500 (FIG. 5) forwards code word 906$^7$ on encoded string 314 (FIG. 3) so that the decoder can learn the symbol. Code word 906$^7$ includes plain symbol 904$^8$ preceded by a prefix bit 404 (FIG. 4A) set to '0' as described in conjunction with FIG. 4A.

After plain symbol 904$^8$ is forwarded, the control logic 500 (FIG. 5) modifies various registers. At step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622 (FIG. 6), the control logic 500 (FIG. 5) determines that there is another valid symbol (not EOS) in the input string 502 and processing continues with step 601 (FIG. 6).

The string register 512 (FIG. 5) is empty. At step 601 (FIG. 6), the contents of the input string pointer register 514 still point to symbol 904$^8$ in the input string 502 (FIG. 5). The control logic 500 concatenates the symbol 904$^8$ with the contents of the string register 512 (FIG. 5). At step 602 (FIG. 6), the control logic 500 (FIG. 5) forwards the contents of the string register 512 (FIG. 5) as the search key 504 (FIG. 5) to the coding table 300 (FIG. 5). The coding table 300 (FIG. 5) searches the dictionary 308 for the symbol 904$^8$. At step 604 (FIG. 6), the symbol 904$^8$ is found in the dictionary 308 (FIG. 5) because it was stored in the dictionary 308 (FIG. 5) in the previous iteration through steps 601–622 (FIG. 6).

At step 620 (FIG. 6), the control logic 500 (FIG. 5) increments the input string pointer 514 to point to the next symbol 904$^9$ in the input string 502 (FIG. 5). At step 621 (FIG. 6), the control logic 500 (FIG. 5) increments the number of symbols. At step 622 (FIG. 6), the control logic 500 (FIG. 5) determines from the input string 502 (FIG. 5) that there are more symbols to encode. Processing continues with step 601 (FIG. 6) with the input string pointer pointing to the next symbol 904$^9$ 'we' in the input string and the string register storing symbol 904$^8$ 'b/'.

At step 601 (FIG. 6), the control logic 500 (FIG. 5) concatenates symbol 904$^8$ with the next symbol 904$^9$ stored in the string register 512 (FIG. 5). At step 602 (FIG. 6), the control logic 500 (FIG. 5) forwards the sequence of symbols 'b/we' as the search key 504 to the coding table 300. The coding table 300 searches the dictionary 308 for the sequence of symbols 'b/we'. At step 604 (FIG. 6), the sequence of symbols 'b/we' is not found. At step 606 (FIG. 6), the sequence of symbols 'b/we' is learned by storing the sequence of symbols at index 13 in the dictionary 308. The sequence of symbols is not stored in plain. Instead, the sequence of symbols 'b/we' is stored with index 12 referencing its prefix because symbol 'b/' is stored at index 12. The sequence of symbols 'b/we' is stored at index 13 as (12, we), with 'b/' stored as index 12 and 'we' stored in plain. The number of symbols in the string register 512 (FIG. 5) is two. Thus, at step 612 (FIG. 6), the control logic 500 (FIG. 5)

determines that the last number of symbols in the last added string stored is one and at step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622, the control logic 500 (FIG. 5) determines that there is another valid symbol (not EOS) in the input string 502 and processing continues with step 601.

The contents of the input string pointer 514 (FIG. 5) point to symbol $904^9$. The string register 512 is empty. At step 601 (FIG. 6), the control logic concatenates the next symbol $904^9$ 'we' in the input string 502 (FIG. 5) with the contents of the string register 512 (FIG. 5) which is empty. At step 602 (FIG. 6), the control logic 500 forwards the contents of the string register 512 (FIG. 5), that is, the next symbol $904^9$ 'we' in the input string 502 as the search key 504 (FIG. 5) to the coding table 300. The coding table 300 (FIG. 5) searches the dictionary 308 for the symbol $904^9$. At step 604 (FIG. 6), the symbol $904^9$ is found.

At step 620 (FIG. 6), the control logic 500 (FIG. 5) increments the input string pointer 514 (FIG. 5) to point to the next symbol $904^{10}$ in the input string 502 (FIG. 5). At step 621 (FIG. 6), the control logic 500 (FIG. 5) increments the number of symbols. At step 622 (FIG. 6), the control logic 500 (FIG. 5) determines from the input string 502 (FIG. 5) that there are more symbols to encode. Processing continues with step 601 (FIG. 6) with the input string pointer pointing to the next symbol $904^{10}$ 't/' in the input string and the string register storing symbol $904^9$ 'we'.

At step 601 (FIG. 6), the control logic 500 (FIG. 5) concatenates symbol $904^9$ with the next symbol $904^{10}$ in the input string 502. At step 602 (FIG. 6), the control logic 500 (FIG. 5) forwards the sequence of symbols 'wet/' as the search key 504 to the coding table 300. The coding table 300 searches the dictionary 308 for the sequence of symbols 'wet/'. At step 604 (FIG. 6), the sequence of symbols 'wet/' is not found. At step 606 (FIG. 6), the sequence of symbols 'wet/' is learned by storing the sequence of symbols at index 14 in the dictionary 308. The sequence of symbols is not stored in plain. Instead, the sequence of symbols 'wet/' is stored with index 9 referencing its prefix because symbol 'we' is stored at index 9. The sequence of symbols 'wet/' is stored at index 14 as (9, t/), with 'we' already stored as index 9 and 't/' stored in plain. The number of symbols in the string register 512 (FIG. 5) is two. Thus, at step 612 (FIG. 6), the control logic 500 (FIG. 5) determines that the last number of symbols in the last added string is not one and at step 614 (FIG. 6), the control logic 500 (FIG. 5) forwards code word $906^8$ on encoded string 314 (FIG. 3). Code word $906^8$ includes index 9 preceded by '1' as described in conjunction with FIG. 4B. At step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622, the control logic 500 (FIG. 5) determines that there is another valid symbol (not EOS) in the input string 502 and processing continues with step 601. The contents of the string pointer register 514 (FIG. 5) point to the symbol $904^{10}$. The string register 512 (FIG. 5) is empty. At step 601 (FIG. 6), the control logic concatenates the next symbol $904^{10}$ 't/' in the input string 502 (FIG. 5) with the contents of the string register 512 (FIG. 5) which is empty. At step 602 (FIG. 6), the control logic 500 forwards the contents of the string register 512 (FIG. 5), that is, the next symbol $904^{10}$ 't/' in the input string 502 as the search key 504 (FIG. 5) to the coding table 300. The coding table 300 (FIG. 5) searches the dictionary 308 for the symbol $904^{10}$. At step 604 (FIG. 6), the symbol $904^{10}$ is not found. At step 606 (FIG. 6), the coding table 300 (FIG. 5) learns the symbol $904^{10}$ by storing the symbol $904^{10}$ at index 15 in the dictionary 308 and indicates that the symbol $904^{10}$ is being learned through learn 508. At step 608 (FIG. 6), the number of symbols stored is '1', thus processing continues with step 610 (FIG. 6). At step 610 (FIG. 6), the control logic 500 (FIG. 5) forwards code word $906^9$ on encoded string 314 (FIG. 3) so that the decoder can learn the symbol. Code word $906^9$ includes plain symbol $904^9$ preceded by a prefix bit 404 (FIG. 4A) set to '0' as described in conjunction with FIG. 4A.

After plain symbol $904^{10}$ is forwarded, the control logic 500 (FIG. 5) modifies various registers. At step 616 (FIG. 6), the control logic 500 (FIG. 5) sets the last added length 522 (FIG. 5) to the contents of the length of the current string 518 (FIG. 5) and the length of the current string 518 (FIG. 5) is set to '1'. At step 617 (FIG. 6), the control logic 500 (FIG. 5) sets the string register 512 to empty.

At step 622 FIG. 6), the control logic 500 FIG. 5) determines that there is another valid symbol (not EOS) in the input string 502 and processing continues with step 601.

The string register 512 (FIG. 5) is empty. At step 601 (FIG. 6), the contents of the input string pointer register 514 still point to symbol $904^{10}$ in the input string 502 (FIG. 5). The control logic 500 concatenates the symbol $904^{10}$ with the contents of the string register 512 (FIG. 5) which is empty. At step 602 (FIG. 6), the control logic 500 (FIG. 5) forwards the content of the string register 512 (FIG. 5) as the search key 504 (FIG. 5) to the coding table 300 (FIG. 5). The coding table 300 (FIG. 5) searches the dictionary 308 (FIG. 5) for the symbol $904^{10}$. At step 604 (FIG. 6), the symbol $904^{10}$ is found in the dictionary 308 (FIG. 5) because it was stored in the dictionary 308 (FIG. 5) in the previous iteration through steps 601–622 (FIG. 6).

At step 620 (FIG. 6), the control logic 500 (FIG. 5) increments the input string pointer 514 to point to the next symbol in the input string 502 (FIG. 5). At step 621 (FIG. 6), the control logic 500 (FIG. 5) increments the number of symbols.

At step 622 (FIG. 6), the control logic detects end of string. Processing continues with step 624 (FIG. 6).

At step 624 (FIG. 6), the control logic 500 (FIG. 5) forwards the index for end of string in code word $906^{10}$.

The input string with ten symbols excluding end of string requires 160 bits (10×16) assuming each symbol 9041–90410 is 16-bits wide. The sequence of code words $906^{1-10}$ reduces the number of bits transmitted to 120 bits. The 120 bits are calculated as follows: (6×17) plain symbols for code words $906^1$, $906^2$, $906^4$, $906^5$, $906^7$, and $906^9$, three bits for index 2 in code word $906^3$ and five bits for indexes 8 and 9 and 10 in code words $906^6$, $906^8$ and $906^{10}$. This method requires less initial memory for storing the alphabet and less bits for transmitting the encoded stream 314 (FIG. 3) than the LZW algorithm. As the symbols are learned and a repetition or known string is received, the achieved compression increases.

The processing of the encoded data 314 is performed by the decoder 312 using the method described in conjunction with FIGS. 8A–8B.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of increasing throughput of data transmission between an encoder and a decoder comprising:
   a) receiving an input string by the encoder;
   b) selecting a segment of bits from the input string as searchable data to be searched by the encoder;
   c) storing the position of the selected segment within the input string in a position register;
   d) comparing the searchable data with contents of a memory;
   e) upon detecting that the searchable data is stored in the memory, linking a subsequent segment of bits from the input string to the searchable data, storing the position of the subsequent segment within the input string in the position register and comparing the searchable data with the contents of the memory; and
   f) upon detecting that the searchable data is not stored in the memory, storing the subsequent segment of data bits in a next free location in the memory and sending the subsequent segment of data bits to the decoder.

2. The method of claim 1 further comprising:
   g) determining a compression ratio by monitoring a ratio of the number of bits in the input string to the number of bits sent to the decoder.

3. The method of claim 2 further comprising:
   h) upon detecting that the compression ratio is less than a threshold compression ratio, modifying the number of bits in the segment of bits.

4. The method of claim 2 further comprising:
   i) upon detecting that the compression ratio is less than a threshold compression ratio, increasing the number of bits in the segment of bits.

5. A method of encoding a data string comprising:
   receiving an input string at an encoder input, the input string comprising a plurality of symbols, each symbol having a number of bits, the number of bits dependent on a type of data in the input string;
   comparing a first symbol in the received data string with symbols stored in a memory associated with the encoder;
   upon detecting the first symbol is not stored in the memory, writing the first symbol in a free location in the memory;
   upon detecting the first symbol is stored in the memory, forming a sequence of symbols by linking the first symbol with a next sequential symbol in the input string and comparing the sequence of symbols with sequences of symbols stored in the memory;
   upon detecting that the sequence of symbols is not stored in the memory, writing the sequence of symbols at a next sequential free location in the memory;
   upon detecting that the sequence of symbols is stored in the encoder, expanding the sequence of symbols by linking the sequence of symbols with a next sequential symbol in the input string and comparing the expanded sequence of symbols with sequences of symbols stored in the memory; and
   continuing to compare expanded sequences of symbols from the input string with sequences of symbols stored in the memory and writing sequences of symbols into the memory only when the sequences of symbols from the input string are not stored in the encoder until all the symbols in the input string have been compared with symbols stored in the encoder.

6. The method of claim 5 further comprising:
   determining a compression ratio by monitoring a ratio of the number of bits in the input string to the number of bits in the sequence of symbols.

7. The method of claim 6 further comprising:
   upon detecting that the compression ratio is less than a threshold compression ratio, modifying the number of bits in the symbol.

8. The method of claim 6 further comprising:
   upon detecting that the compression ratio is less than a threshold compression ratio, increasing the number of bits in the symbol.

* * * * *